United States Patent
Kobayashi et al.

[11] Patent Number: 5,841,673
[45] Date of Patent: *Nov. 24, 1998

[54] SYSTEM AND METHOD FOR PROCESSING GRAPHIC DELAY DATA OF LOGIC CIRCUIT TO REDUCE TOPOLOGICAL REDUNDANCY

[75] Inventors: Noriya Kobayashi, Tokyo, Japan; Sharad Malik, Princeton, N.J.

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 593,569

[22] Filed: Jan. 30, 1996

[30] Foreign Application Priority Data

Jan. 30, 1995 [JP] Japan .................................. 7-033134

[51] Int. Cl.$^6$ .............................. G06F 17/00; G06F 17/50
[52] U.S. Cl. ........................... 364/489; 364/488; 364/490; 364/491; 364/578
[58] Field of Search .................................. 364/488–491, 364/578; 395/500

[56] References Cited

U.S. PATENT DOCUMENTS

| | | | |
|---|---|---|---|
| 4,916,627 | 4/1990 | Hathaway | 364/490 |
| 5,251,147 | 10/1993 | Finnerty | 364/490 |
| 5,339,253 | 8/1994 | Carrig et al. | 364/489 |
| 5,392,221 | 2/1995 | Donnath et al. | 364/489 |
| 5,448,497 | 9/1995 | Ashar et al. | 364/489 |
| 5,457,638 | 10/1995 | Ashar et al. | 364/490 |
| 5,481,473 | 1/1996 | Kim et al. | 364/490 |
| 5,508,937 | 4/1996 | Abato et al. | 364/488 |
| 5,522,063 | 5/1996 | Ashar et al. | 395/500 |
| 5,535,145 | 7/1996 | Hathaway | 364/578 |

FOREIGN PATENT DOCUMENTS 5-108751   4/1993   Japan .

*Primary Examiner*—Vincent N. Trans
*Assistant Examiner*—Vuthe Siek
*Attorney, Agent, or Firm*—Foley & Lardner

[57] ABSTRACT

A delay network of logic circuit delay data composed of a first set of vertices containing first to fourth vertices, and a first set of weighted directional edges containing a first directional edge extending from the first vertex to the fourth vertex, a second directional edge extending from the second vertex to the third vertex, a third directional edge extending from the first vertex to the third vertex, and a fourth directional edge extending from the second vertex to the fourth vertex, is converted into a delay network composed of a second set of vertices containing the first to fourth vertices and an added fifth vertex, and a second set of weighted directional edges containing a fifth directional edge extending from the first vertex to the fifth vertex, a sixth directional edge extending from the second vertex to the fifth vertex, a seventh directional edge extending from the fifth vertex to the third vertex, and an eighth directional edge extending from the fifth vertex to the fourth vertex.

42 Claims, 15 Drawing Sheets

$$\begin{array}{c} \\ A0 \\ A1 \\ A2 \\ A3 \end{array} \begin{pmatrix} S0 & S1 & S2 & S3 \\ 11 & 21 & 31 & 41 \\ - & 11 & 21 & 31 \\ - & - & 11 & 21 \\ - & - & - & 11 \end{pmatrix}$$

B-α
(⋈–⋈)

(a)   (b)   (c)

Π-I (a)   (b)   (c)

B-X (a)   (b)   (c)

Y-V (a)   (b)   (c)

SYSTEM AND METHOD FOR PROCESSING GRAPHIC DELAY DATA OF LOGIC CIRCUIT TO REDUCE TOPOLOGICAL REDUNDANCY

BACKGROUND OF THE INVENTION

The present invention generally relates to a delay data processing system and a delay data processing method, and particularly, to a system and a method for processing a set of graph-oriented data or graphic data on component-level delay times of a combinational logic circuit to reduce topological redundancy therein, while keeping data quality, as the set of data is typically provided to be held in a memory for a delay computation of the logic circuit.

Description of the Related Art

There are known three types of logic circuit delay data holding systems.

One is a primitive type generally employed to simply hold a largest one of delay times calculated between respective input terminals to respective output terminals of a logic circuit as a target of delay computation.

Another is a matrix type implemented for holding in matrix form a set of delay times calculated between respective input terminals to respective output terminals of a logic circuit as a target of delay computation.

This type of system employs a matrix of an N-row by M-column size for holding the delay times, as the logic circuit has a total of N inputs and a total of M outputs, where N and M are arbitrary integers larger than one, respectively.

FIG. 1 illustrates a data structure to be held in this type of system, assuming a later-described logic circuit of FIG. 13 is the target.

The other type is a conventional graphic system employing a directional graph identical in composition to a target logic circuit.

The directional graph includes a multiplicity of internal vertices representing gates of the logic circuit, and varieties of directional edges representing nets (internal wiring) of the logic circuit. The internal vertices have their weights representing delay times of the gates. The directional edges have their weights representing delay times of the nets.

FIG. 2 illustrates a directional graph to be held in this type of system, assuming the logic circuit of FIG. 13 is the target.

The primitive type is apparently insufficient in data quality, as the delay times may vary by terminals.

The matrix system well assures data quality. However, as many as N×M matrix elements per logic block need to be stored in a large memory area and referenced every time for a delay analysis, consuming much time, resulting in very slow processing, as the logic circuit may be large-scaled.

The graphic system has inherent merit for delay computation, but the conventional graphic system needs a greater memory area for storing an increased quantity of data in proportion to a total number of gates and nets that usually exceeds a number of inputs times a number of outputs, in addition to an increased time consumption in delay analysis.

In this respect, for a reduction in memory area and process time, there has been disclosed a partial delay time analysis system for logic circuitry in the Japanese Patent Application Laid-Open Publication No. 5-108751.

This system employs an output direction propagation path analysis means for analyzing a propagation characteristic in an output direction from a concerned component in a logic circuit in accordance with internal connection relationships of the circuit, an input direction propagation path analysis means for analyzing a propagation characteristic in an input direction from the concerned component in accordance with the internal connection relationships of the circuit, and a concerned propagation path analysis means responding to delay times analysed by the output direction propagation path analysis means and the input direction propagation path analysis means for calculating a delay time of a propagation path including the concerned component on a way thereof, to thereby reduce a necessary time and memory area for a local delay time analysis of the logic circuit.

Therefore, a total memory area is yet increased as a penalty to the facilitated analysis.

The present invention has been achieved with this state of the art in mind.

SUMMARY OF THE INVENTION

It therefore is an object of the present invention to provide a system and a method for processing a set of graph-oriented data or graphic data representing component-level delay times of a combinational logic circuit in a distinctive manner aiming at reducing a topological redundancy, permitting an effective reduction of memory area as well as increased processing speed, while keeping a data quality, as the set of data is provided to be held in a memory for a delay computation of the logic circuit.

To achieve the object, a genus of the present invention provides a delay data processing system comprising a data holding means for holding a first set of graphic data representing a first delay network representative of a set of delay data between a plurality of nodes of logic circuitry, the first delay network being composed of a first set of vertices containing a first vertex, a second vertex, a third vertex, and a fourth vertex, and a first set of weighted directional edges extending between elements of, the first set of vertices, the first set of weighted directional edges containing a first directional edge extending from the first vertex to the fourth vertex, a second directional edge extending from the second vertex to the third vertex, a third directional edge extending from the first vertex to the third vertex, and a fourth directional edge extending from the second vertex to the fourth vertex, and a data processing means for processing the first set of graphic data to obtain a second set of graphic data representing a second delay network composed of a second set of vertices containing the first vertex, the second vertex, the third vertex, the fourth vertex, and a fifth vertex not contained in the first set of vertices, and a second set of weighted directional edges extending between elements of the second set of vertices, the second set of weighted directional edges containing a fifth directional edge extending from the first vertex to the fifth vertex, a sixth directional edge extending from the second vertex to the fifth vertex, a seventh directional edge extending from the fifth vertex to the third vertex, and an eighth directional edge extending from the fifth vertex to the fourth vertex.

According to the genus of the invention, a butterfly-like directional graph is transformed into an X form, without changing data quality.

There is thus effectively reduced a topological redundancy in data composition.

According to a species of the genus of the invention, an arbitrary one of the first to fourth directional edges extending between associated two of the first to fourth vertices in the first delay network is weighted by a first weight representing a delay therealong, the associated two vertices have in the second delay network an edge route therebetween consisting of corresponding two of the fifth to eighth directional edges, and the edge route has a total weight therealong equivalent to the first weight.

According to another species of the genus of the invention, the data holding means holds the second set of graphic data as the first set of graphic data.

According to another species of the genus of the invention, the data processing means is operable to process the second set of graphic data as the first set of graphic data.

According to another species of the genus of the invention, the first set of vertices contains a first concerned vertex, a second concerned vertex, a third concerned vertex, and a fourth concerned vertex, and the first set of weighted directional edges contains a first concerned edge extending from the first concerned vertex to the second concerned vertex, a second concerned edge extending from the second concerned vertex to the third concerned vertex, and a third concerned edge extending from the second concerned vertex to the fourth concerned vertex, and the data processing means is operable to process the first set of graphic data to obtain a third set of graphic data representing a third delay network composed of a third set of vertices containing the first concerned vertex, the third concerned vertex, and the fourth concerned vertex, and a third set of weighted directional edges extending between elements of the third set of vertices, the third set of weighted directional edges containing a ninth directional edge extending from the first concerned vertex to the third concernd vertex, and a tenth directional edge extending from the first concerned vertex to the fourth concerned vertex, the ninth and tenth directional edges being not contained in the first set of weighted directional edges.

According to an individual of this species of the invention, the first concerned edge has a first weight, the second concerned edge has a second weight, and the third concerned edge has a third weight, and the ninth directional edge has a weight equivalent to a sum of the first weight and the second weight, and the tenth directional edge has a weight equivalent to a sum of the first weight and the third weight.

According to another individual of this species of the invention, the data holding means holds the third set of graphic data as the first set of graphic data.

According to another individual of this species of the invention, the data processing means is operable to process the third set of graphic data as the first set of graphic data.

According to another species of the genus of the invention, the first set of vertices contains a first concerned vertex, a second concerned vertex, a third concerned vertex, and a fourth concerned vertex, and the first set of weighted directional edges contains a first concerned edge extending from the first concerned vertex to the third concerned vertex, a second concerned edge extending from the second concerned vertex to the third concerned vertex, and a third concerned edge extending from the third concerned vertex to the fourth concerned vertex, and the data processing means is operable to process the first set of graphic data to obtain a third set of graphic data representing a third delay network composed of a third set of vertices containing the first concerned vertex, the second concerned vertex, and the fourth concerned vertex, and a third set of weighted directional edges extending between elements of the third set of vertices, the third set of weighted directional edges containing a ninth directional edge extending from the first concerned vertex to the fourth concernd vertex, and a tenth directional edge extending from the second concerned vertex to the fourth concerned vertex, the ninth and tenth directional edges being not contained in the first set of weighted directional edges.

According to an individual of this species of the invention, the first concerned edge has a first weight, the second concerned edge has a second weight, and the third concerned edge has a third weight, and the ninth directional edge has a weight equivalent to a sum of the first weight and the third weight, and the tenth directional edge has a weight equivalent to a sum of the second weight and the third weight.

According to another species of the genus of the invention, the first set of vertices contains a first concerned vertex, and a second concerned vertex, and the first set of weighted directional edges contains a first concerned edge extending from the first concerned vertex to the second concerned vertex and having a first weight, and a second concerned edge extending from the first concerned vertex to the second concerned vertex and having a second weight not exceeding the first weight, and the system further comprises another data processing means for processing the first set of graphic data to obtain a third set of graphic data representing a third delay network composed of a third set of vertices containing the first concerned vertex, and the second concerned vertex, and a third set of weighted directional edges extending between elements of the third set of vertices, the third set of weighted directional edges containing the first concerned edge, the third set of weighted directional edges not containing the second concerned edge.

According to another species of the genus of the invention, the first set of vertices contains a first concerned vertex, a second concerned vertex, a third concerned vertex, a fourth concerned vertex, and a fifth concerned vertex, and the first set of weighted directional edges contains a first concerned edge extending from the first concerned vertex to the fifth concerned vertex, a second concerned edge extending from the second concerned vertex to the fifth concerned vertex, a third concerned edge extending from the fifth concerned vertex to the third concerned vertex, and a fourth concerned edge extending from the fifth concerned vertex to the fourth concerned vertex, and the data processing means is operable to process the first set of graphic data to obtain a third set of graphic data representing a third delay network composed of a third set of vertices containing the first concerned vertex, the second concerned vertex, the third concerned vertex, and the fourth concerned vertex, the third set of vertices not containing the fifth concerned vertex, and a third set of weighted directional edges extending between elements of the third set of vertices, the third set of weighted directional edges containing a ninth directional edge extending from the first concerned vertex to the fourth concernd vertex, a tenth directional edge extending from the second concerned vertex to the third concerned vertex, an eleventh directional edge extending from the first concerned vertex to the third concerned vertex, and a twelfth directional edge extending from the second concerned vertex to the fourth concerned vertex, the ninth to twelfth directional edges being not contained in the first set of weighted directional edges.

According to another species of the genus of the invention, the second set of weighted directional edges does not contain the first directional edge, the second directional edge, and the fourth directional edge.

According to an individual of this species of the invention, the second set of weighted directional edges does not contain the third directional edge.

Moerover, to achieve the object described, another genus of the present invention provides a delay data processing method comprising the steps of holding a first set of graphic data representing a first delay network representative of a set of delay data between a plurality of nodes of logic circuitry, the first delay network being composed of a first set of vertices containing a first vertex, a second vertex, a third vertex, and a fourth vertex, and a first set of weighted directional edges extending between elements of the first set of vertices, the first set of weighted directional edges containing a first directional edge extending from the first vertex to the fourth vertex, a second directional edge extending from the second vertex to the third vertex, a third directional edge extending from the first vertex to the third vertex, and a fourth directional edge extending from the second vertex to the fourth vertex, and processing the first set of graphic data to obtain a second set of graphic data representing a second delay network composed of a second set of vertices containing the first vertex, the second vertex, the third vertex, the fourth vertex, and a fifth vertex not contained in the first set of vertices, and a second set of weighted directional edges extending between elements of the second set of vertices, the second set of weighted directional edges containing a fifth directional edge extending from the first vertex to the fifth vertex, a sixth directional edge extending from the second vertex to the fifth vertex, a seventh directional edge extending from the fifth vertex to the third vertex, and an eighth directional edge extending from the fifth vertex to the fourth vertex.

According to a species of this genus of the invention, the method further comprises holding the second set of graphic data as the first set of graphic data.

According to another species of this genus of the invention, the first set of vertices contains a first concerned vertex, a second concerned vertex, a third concerned vertex, and a fourth concerned vertex, and the first set of weighted directional edges contains a first concerned edge extending from the first concerned vertex to the second concerned vertex a second concerned edge extending from the second concerned vertex to the third concerned vertex, and a third concerned edge extending from the second concerned vertex to the fourth concerned vertex, and the method further comprises processing the first set of graphic data to obtain a third set of graphic data representing a third delay network composed of a third set of vertices containing the first concerned vertex, the third concerned vertex, and the fourth concerned vertex, and a third set of weighted directional edges extending between elements of the third set of vertices, the third set of weighted directional edges containing a ninth directional edge extending from the first concerned vertex to the third concernd vertex, and a tenth directional edge extending from the first concerned vertex to the fourth concerned vertex, the ninth and tenth directional edges being not contained in the first set of weighted directional edges.

According to an individual of this species of the invention, the method further comprises holding the third set of graphic data as the first set of graphic data.

According to an individual of this species of the invention, the method further comprises processing the third set of graphic data as the first set of graphic data.

According to another species of this genus of the invention, the first set of vertices contains a first concerned vertex, a second concerned vertex, a third concerned vertex, and a fourth concerned vertex, and the first set of weighted directional edges contains a first concerned edge extending from the first concerned vertex to the third concerned vertex, a second concerned edge extending from the second concerned vertex to the third concerned vertex, and a third concerned edge extending from the third concerned vertex to the fourth concerned vertex, and the method further comprises processing the first set of graphic data to obtain a third set of graphic data representing a third delay network composed of a third set of vertices containing the first concerned vertex, the second concerned vertex, and the fourth concerned vertex, and a third set of weighted directional edges extending between elements of the third set of vertices, the third set of weighted directional edges containing a ninth directional edge extending from the first concerned vertex to the fourth concernd vertex, and a tenth directional edge extending from the second concerned vertex to the fourth concerned vertex, the ninth and tenth directional edges being not contained in the first set of weighted directional edges.

According to another species of this genus of the invention, the first set of vertices contains a first concerned vertex, and a second concerned vertex, and the first set of weighted directional edges contains a first concerned edge extending from the first concerned vertex to the second concerned vertex and having a first weight, and a second concerned edge extending from the first concerned vertex to the second concerned vertex and having a second weight not exceeding the first weight, and the mehtod further comprises processing the first set of graphic data to obtain a third set of graphic data representing a third delay network composed of a third set of vertices containing the first concerned vertex, and the second concerned vertex, and a third set of weighted directional edges extending between elements of the third set of vertices, the third set of weighted directional edges containing the first concerned edge, the third set of weighted directional edges not containing the second concerned edge.

According to another species of this genus of the invention, the first set of vertices contains a first concerned vertex, a second concerned vertex, a third concerned vertex a fourth concerned vertex, and a fifth concerned vertex, and the first set of weighted directional edges contains a first concerned edge extending from the first concerned vertex to the fifth concerned vertex a second concerned edge extending from the second concerned vertex to the fifth concerned vertex, a third concerned edge extending from the fifth concerned vertex to the third concerned vertex, and a fourth concerned edge extending from the fifth concerned vertex to the fourth concerned vertex, and the data processing method further comprising processing the first set of graphic data to obtain a third set of graphic data representing a third delay network composed of a third set of vertices containing the first concerned vertex, the second concerned vertex, the third concerned vertex, and the fourth concerned vertex, the third set of vertices not containing the fifth concerned vertex, and a third set of weighted directional edges extending between elements of the third set of vertices, the third set of weighted directional edges containing a ninth directional edge extending from the first concerned vertex to the fourth concernd vertex, a tenth directional edge extending from the second concerned vertex to the third concerned vertex, an eleventh directional edge extending from the first concerned vertex to the third concerned vertex, and a twelfth directional edge extending from the second concerned vertex to the fourth concerned vertex, the ninth to twelfth directional edges being not contained in the first set of weighted directional edges.

Further, to achieve the object, another genus of the present invention provides a logic circuit delay data holding system for holding a set of delay data of a target logic circuit having a multiplicity of inputs and a multiplicity of outputs, the system comprising a delay network generation means for responding to a set of constitutional data of the logic circuit to generate a delay network composed of a plurality of source vertices corresponding to a plurality of input terminals of the logic circuit, a plurality of sink vertices corresponding to a plurality of output terminals of the logic circuit, a plurality of internal vertices lying on a plurality of paths connecting the source vertices with the sink vertices, and a plurality of directional edges each interconnecting two of the source, sink and internal vertices, the directional edges being each weighted so that a largest weighted path length between any concerned one of the source vertices and any concerned one of the sink vertices is in accord with a delay time between a corresponding one of the input terminals of the logic circuit and a corresponding one of the output terminals of the logic circuit, a delay network hold means for holding the set of delay data, as it represents the delay network, and a delay network transform means for transforming the delay network to reduce a quantity of the delay data in the delay network hold means so that the largest weighted path length between the concerned source vertex and the concerned sink vertex is in accord with the delay time between the corresponding input terminal of the logic circuit and the corresponding output terminal of the logic circuit.

Still more, to achieve the object, another genus of the present invention provides a logic circuit delay data holding method for holding a set of delay data of a logic circuit with a multiplicity of inputs and a multiplicity of outputs, the logic circuit being a target of a delay computation, the method comprising a first step of responding to a set of constitutional data of the logic circuit to generate a delay network including a plurality of source vertices corresponding to a plurality of input terminals of the logic circuit, a plurality of sink vertices corresponding to a plurality of output terminals of the logic circuit, and a plurality of paths cooperatively connecting the source vertices with the sink vertices, the plurality of paths consisting of a plurality of directional edges each weighted so that a total weight along a most-weighted path between any concerned one of the source vertices and any concerned one of the sink vertices is in accord with a delay time between one of the input terminals corresponding to the concerned source vertex and one of the output terminals corresponding to the concerned source vertex, a second step of holding the set of delay data, as it represents the delay network, and a third step of transforming the delay network to reduce a quantity of the delay data in the delay network hold means so that the total weight along the most-weighted path between the concerned source vertex and the concerned sink vertex is kept in accord with the delay time between said one of the input terminals corresponding to the concerned source vertex and said one of the output terminals corresponding to the concerned source vertex.

According to a species of this genus of the invention, the first step comprises generating a first one of the source vertices corresponding to a first one of the input terminals, generating a first one of the sink vertices corresponding to a first one of the output terminals having a signal-transmittable relationship relative to the first input terminal, generating a first one of the directional edges connecting the first source vertex with the first sink vertex and having a sense thereof according to a signal transmission direction between the first input terminal and the first output terminal, calculating a delay time between the first input terminal and the first output terminal, and providing the first directional edge with a first weight representing the delay time.

According to an individual of this species of the invention the delay network further includes one or more internal vertices corresponding to one or more gates of the logic circuit, and the first step further comprises generating a first one of the internal vertices corresponding to a first one of the gates connected by a first net to at least one of the first input and first output terminals as a related terminal of the logic circuit, generating a second one of the directional edges corresponding to the first net, the second directional edge connecting the first internal vertex with one of the first source and first sink vertices corresponding to the related terminal and having a sense thereof according to a signal transmission direction of the first net, providing the second directional edge with a second weight representing a delay time of the first net, and additionally providing the second directional edge with a third weight representing a delay time of the first gate.

According to this individual of the invention, the delay network may includes a first graph composed of a pair of triangles joining each other at one point, where they are angled, and the third step may comprise transforming the first graph into a second graph composed of a quartet of line segments joining each other at one point, where they end.

Moreover, according to this individual of the invention, the third step may further comprise transforming the first graph into a third graph composed of another triangle and a pair of line segments ending at one angle of said another triangle.

Further, according to this individual of the invention, the delay network may include a third graph composed of a triple of line segments joining each other at one point, where they end, and the third step may further comprise transforming the third graph into a fourth graph composed of a pair of line segments joining each other one point, where they end.

Furthermore, according to this individual of the invention, the delay network may include a fifth graph composed of a pair of line segments joining each other at two points, where they end, and the third step may further comprise transforming the fifth graph into a sixth graph composed of a single line segment ending at the two points.

Therefore, according to the present invention, a delay network is generated for holding delay data of a logic circuit. Then, the delay network is rendered concise to permit an effective holding in a reduced memory area, while keeping a data quality.

Moreover, the conciseness of the delay network is achieved in a direction permitting an higher processing speed in delay analysis of a target logic circuit, in particular, for a total delay analysis of a large-scale logic circuit in which a target logic circuit is installed as a logic block.

An advantage due to a possible saving of time may be significant with efficient contributions not simply to a logic design, but also such as to a layout design, a post-design estimation, and other many fields of logic circuit design.

BRIEF DESCRIPTION OF THE DRAWINGS

The objects, features and advantages of the present invention will become more apparent from consideration of the following detailed description, in conjunction with the accompanying drawings, in which.

DETAILED DESCRIPTION OF THE PREFERRED EMBODIMENTS

There will be detailed below the preferred embodiments of the present invention with reference to the accompanying drawings.

Figure 3:
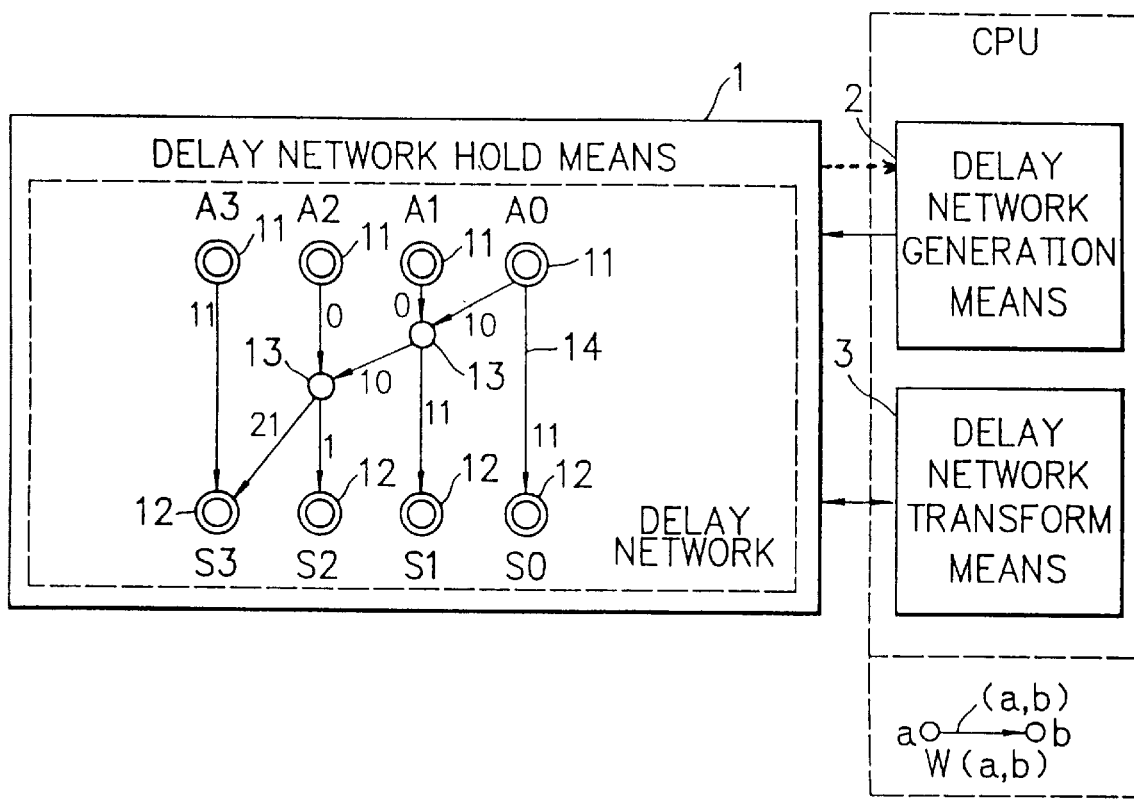
FIG. 3 is a block diagram of a delay data processor according to an embodiment of the invention.

FIG. 3 shows a logic circuit delay data processor according to an embodiment of the invention.

The delay data processor is implemented for processing a set of original delay data on a logic circuit having a multiplicity of input terminals and a multiplicity of output terminals to obtain a set of graphic data representing a delay network of a desired form for a delay computation of the logic circuit, while holding the original data and processed data at various steps of the process, as necessary.

The logic circuit from which the original delay data are obtained is sometimes called "target (logic) circuit", as it is an inherent target of the delay computation. The delay network is a kind of delay data structure represented by a graph with directional edges (hereafter sometimes simply "edge") according to a graph theory.

The delay data processor of FIG. 3 comprises a delay network hold means 1 as memories for storing various associated data including delay network representative data, and a central processing unit CPU having necessary program files.

Some program files cooperatively serve as a delay network generation means 2 for processing the original delay data to generate a set of original graphic data representing a delay network of an original form, and some program files serve as a delay network transform means 3 for processing the original graphic data to stepwise transform the delay network from the original form into the desired form, cooperating with the delay network hold means 1 in an alternating manner.

A typical delay network is composed of a set of vertices including a number of source vertices 11 corresponding to input terminals of a target logic circuit, a number of sink vertices 12 corresponding to output terminals of the target circuit, and a number of internal vertices 13 corresponding to internal nodes of the target circuit or to imaginary nodes provisionally provided for a calculation, and a set of directional edges 14 each respectively connecting a corresponding vertex to an associated vertex.

Source vertices 11 are sometimes individually identified herein by A-numbers, such as A0, A1, A2, A3, and sink vertices 12 are sometimes identified by S-numbers, such as S0, S1, S2, S3. In some delay networks, the set of vertices may contain no internal vertices (13). Directional edges 14 are each weighted by an associated weight representing a delay time therealong. The weight is evaluated, e.g. that of an edge 14 extending from a source vertex A0 to a sink vertex S0 has a value of "11". Some edges may have a 0 weight, like that from source vertex A1 to internal vertex 13.

Three key points to a better comprehension of actions of the delay data processor of FIG. 3 will be described below in order of (1) characteristics of delay network in the hold means 1, (2) how to generate an original delay network, i.e. a delay network generation method programmed for or applicable to the generation means 2, and (3) how to transform the original delay network into a desired delay network for a delay computation, i.e. a delay network transform method programmed for or applicable to the transform means 3.

(1) Characteristics of delay network:

Any delay network represented by a set of graphic data held in the delay network hold means 1 has an according composition to an associated target logic circuit so that "a delay time between an input terminal and an output terminal of the logic circuit" is in accord with "a largest weighted path length [in terms of a largest one of sums of weights (of constituent directional edges 14) of routes] between a source vertex 11 corresponding to the input terminal and a sink vertex 12 corresponding to the output terminal", permitting an accurate delay analysis of the target circuit to be executed on the the delay network.

Each directional edge 14 in the delay network has a "sense" thereof in accordance with a signal transmission direciton of the target logic circuit.

For generation of such a delay network, the delay network generation means 2 inputs necessary compositional data (i.e. information on circuit arrangement with respect to input terminals, output terminals, gates and net connections) of a target logic circuit, as well as data on delay times of constituent elements. Based on the data, the means 2 generates an original delay network having directional edges 14 therein weighted so that "a delay time between an arbitrary input terminal and an arbitrary output terminal of the target circuit" is in accord with "a largest weighted path length between a corresponding source vertex 11 and a corresponding sink vertex 12", which network is held in the hold means 1.

The delay network transform means 3 transforms the original delay network into a concise delay network (i.e. a complexity-reduced delay network with a reduced number of directional edges 14 and/or a reduced number of internal vertices 13) in which "a delay time between an arbitrary input terminal and an arbitrary output terminal of the target circuit" is still in accord with "a largest weighted path length between a corresponding source vertex 11 and a corresponding sink vertex 12", which network also is held in the hold means 1.

A first key point of the invention resides in an effective employment of the network of delay data having such a composition, concurrently permitting an accurate holding of the delay data, a reduced memory area for storing the delay data, and an increased speed of delay analysis, as the conciseness of network allows a necessary memory region for storage of delay data of the target logic circuit to be reduced and a delay analysis of the target circuit to be executed at an increased speed.

Figure 13:
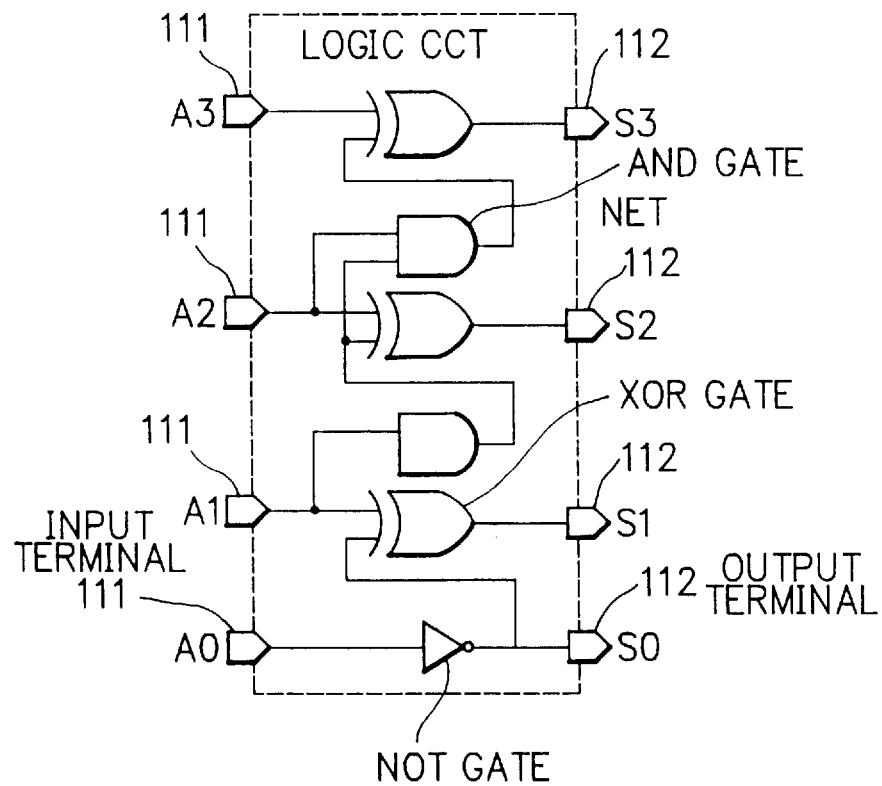
FIG. 13 is a circuit diagram of an exemplary logic circuit as a target of the processor of FIG. 3.

FIG. 3 illustrates a delay network, of which a target logic circuit is shown in FIG. 13. Namely, four source vertices A0 to A3 at numeral 11 in FIG. 3 correspond to four input terminals A0 to A3 at numeral 111 in FIG. 13; and four sink vertices S0 to S3 at 12 in FIG. 3, to four output terminals S0 to S3 at 112 in FIG. 13.

In the logic circuit of FIG. 13, there is assumed a delay time "9" at each of two AND gates, a delay time "9" at each of three XOR (i.e. EX-OR) gates, a delay time "9" at a NOT gate, and a delay time "1" at each net. Then, e.g., a delay time between from A0 input terminal 111 to S3 output terminal 112 in FIG. 13 is calculated as "41", which corresponds to a largest weighted path length "41" between from A0 source vertex 11 to S3 sink vertex 12 in FIG. 3.

(2) Generation of delay network:

The delay network generation means 2 inputs a set of original delay data (i.e. composition data associated with delay times) of a target logic circuit (hereafter sometimes "constitutional data"), generates an original delay network based on the constitutional data, and outputs the original delay network to the delay network holds means 1, where it is stored. For the generation of delay network, the CPU is provided with a pair of selective program files defining different generation procedures as described below.

Figure 4:
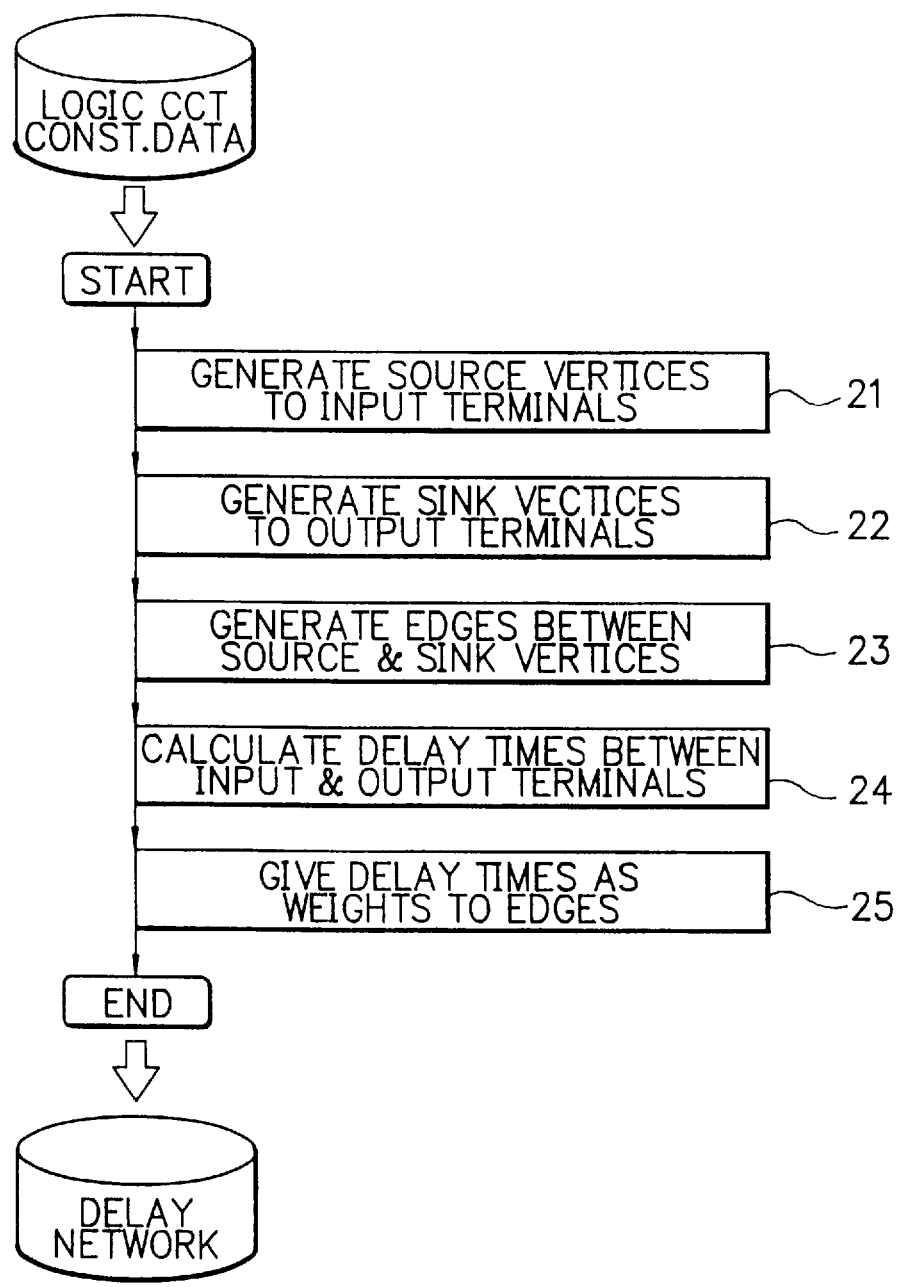
FIG. 4 is a flow chart of a process in a delay network generation means of the processor of FIG. 3.

FIG. 4 shows one procedure for generating a delay network.

In FIG. 4, the procedure is given in a form of flow chart, as a delay network generation process comprising a source vertex generation step 21, a sink vertex generation step 22, a directional edge generation process 23, a delay time calculation step 24, and a directional edge weighting step 25.

With the original delay data input, the delay network generation means 2 starts the generation process of FIG. 4, as it is selected by the CPU.

The program flow first goes to the step 21, where source vertices corresponding to input terminals of the target logic circuit are generated, and then to the step 22, where sink vertices corresponding to output terminals of the target circuit are generated.

Then, at the step 23, directional edges are generated between the source vertices and the sink vertices, in correspondence to connections between the input terminals and the output terminals of the target circuit. More specifically, between a respective one of the source vertices generated at the step 21 and a corresponding one of the sink vertices generated at the step 22 that receives a signal transmitted from the respective one of source vertex, there is generated a directional edge with an according sense to a direction of transmission of the signal.

At the step 24, an actual delay time is calculated along any path between the input terminals and the output terminals of the target circuit, to determine a delay time for each edge generated at the step 23.

Finally, at the step 25, a representative data of the delay time is provided as a weight to a graphic data of a corresponding directional edge so that each edge is weighted.

As a result, an original bipartite delay network is generated and output to the delay network hold means 1, where it is stored as a set of original graphic data.

Letting N be a number of the input terminals and M be a number of the output terminals of the target logic circuit, the original delay network generated by the process of FIG. 4 has a total of N source vertices, a total of M sink vertices and a total of at most N×M directional edges. Therefore, a necessary memory region for storing the set of original graphic data is identical, in terms of an order of a bit number, to that for storing a conventional matrix of logic circuit delay data such as the delay data matrix of FIG. 1.

Figure 14:
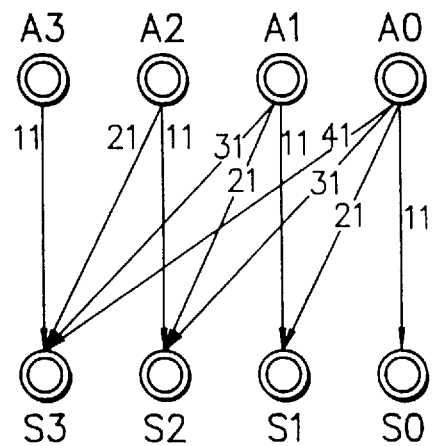
FIG. 14 is an original delay network generated by the process of FIG. 4.

FIG. 14 illustrates an original delay network of the target logic circuit of FIG. 13, as it is generated by the generation process of FIG. 4.

In other words, the delay network of FIG. 14 comprises a directional graph (consisting of four source vertices A0 to A3, four sink vertices S0 to S3 and ten directional edges) generated at the steps 21, 22 and 23 of FIG. 4, and delay times calculated at the step 24 of FIG. 4 and provided as weights (to the edges) at the step 25 of FIG. 4.

Figure 5:
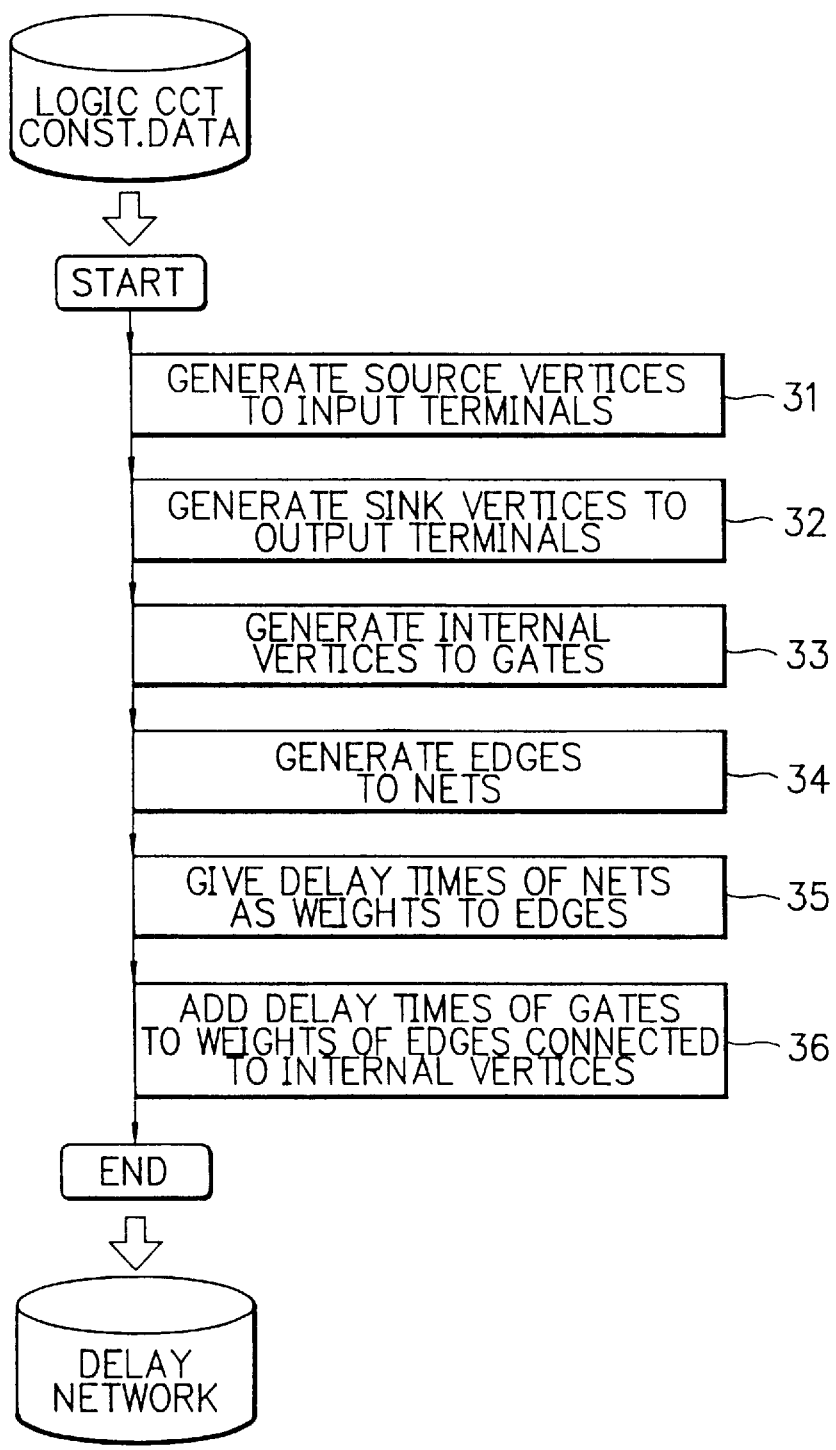
FIG. 5 is a flow chart of another process in the delay network generation means of the processor of FIG. 3.

The other procedure for generating a delay network is shown in FIG. 5.

In FIG. 5, the procedure is given in a form of flow chart as a delay network generation process comprising a source vertex generation step 31, a sink vertex generation step 32, an internal vertex generation step 33, a directional edge generation process 34, a first weighting step 35, and a second weighting step 36.

With the original delay data input, the delay network generation means 2 starts the generation process of FIG. 5, as it is selected by the CPU.

The program flow first goes to the step 31, where source vertices corresponding to input terminals of the target logic circuit are generated, and then to the step 32, where sink vertices corresponding to output terminals of the target circuit are generated, and further to the step 33, where internal vertices corresponding to gates (i.e. AND, XOR, NOT in FIG. 13) of the target circuit are generated.

Then, at the step 34, directional edges are generated in correspondence to nets in the target circuit. As each net is associated with an input terminal, an output terminal and/or a gate of the target circuit (see FIG. 13), a corresponding edge is linked to a corresponding source vertex, a corresponding output terminal and/or a corresponding gate and has a sense thereof set in accord with a direction of signal transmission of the net.

At the step 35, an actual delay time of any net is read (or calculated) as a delay time ("1") for a corresponding edge, and provided as a weight to the edge, so that each edge is weighted.

Finally, at the step 36, an actual delay time of any gate is read (or calculated) as a reflectable delay time ("9") to each directional edge that e.g. starts from an internal vertex corresponding to the gate, and is provided as an additional weight to the edge, so that each such edge is weighted with a sum ("10") of the weight ("1") given in the step 35 and the additional weight ("9") given in this step 36.

In this respect, the reflection of delay time of a gate may be effected in a manner other than tranferring the delay to each directional edge starting from the gate, in accordance with a general rule that the delay time of a gate shall be transferred as an additional weight to each selected one of directional edges connecting to an internal vertex corresponding to the gate, by a graph theory. For example, a delay time of a gate may be transferred as an additional weight to a directional edge ending at an internal vertex corresponding to the gate.

As a result, an original topological delay network is generated and output to the delay network hold means 1, where it is stored as a set of original graphic data.

Thus, the generation process of FIG. 5 provides a directional graph identical in topology to a composition of gates and nets in a target logic circuit, as it has directional edges therein each weighted to constitute a delay network of the target circuit, with a weight representing a delay time of a corresponding net and further with an additional weight depending on a delay time of a gate corresponding to an internal vertex, if any, that the edge connects to.

Figures 1, 2:
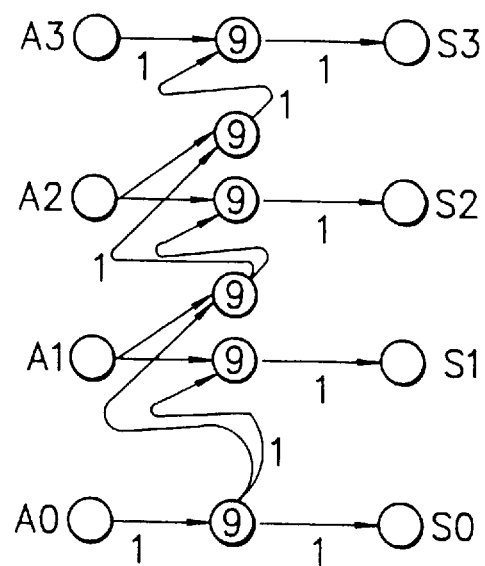
FIG. 1 is an example of a conventional matrixed delay data.
FIG. 2 is an example of a conventional graphic delay data.

The original delay network generated by the process of FIG. 5 has an identical graphic (or topological) structure to the conventional directional graph shown in FIG. 2, whereas vertices as well as directional edges in the latter have their weights contrary to those (source, sink and internal vertices) in the former have no weights assigned thereto. Therefore, a necessary memory region for storing the set of original graphic data is reduced by a fraction for weights of vertices, relative to that for storing a conventional graphic data such as of the directional graph shown in FIG. 2.

Figure 15:
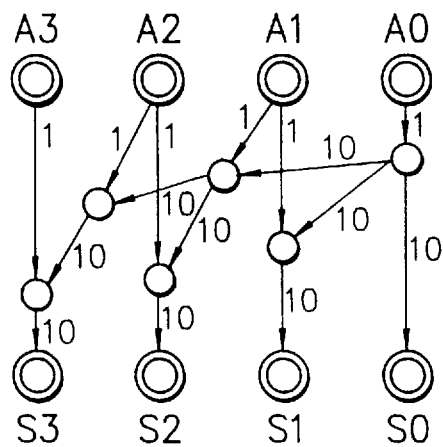
FIG. 15 is an original delay network generated by the process of FIG. 5.

FIG. 15 illustrates an exemplary original delay network of the target logic circuit of FIG. 13, as it is generated by the generation process of FIG. 5.

In other words, the delay network of FIG. 15 comprises a directional graph (consisting of four source vertices A0 to A3, four sink vertices S0 to S3, six internal vertices and fifteen directional edges) generated at the steps 31, 32, 33 and 34 of FIG. 5, and sums ("1" or "10") of weights ("1") provided (to the fifteen edges) at the step 35 and additional weights ("9") provided (to nine of the fifteen edges) at the step 36 of FIG. 5.

(3) Transformation of delay network:

The delay network transform means 3 of FIG. 3 inputs a set of graphic data representing a delay network of the target logic circuit of FIG. 13, processes the data to transform the delay network for an adaptation of graph composition and a reduction of data quantity thereof, and outputs a set of processed graphic data representing a transformed delay network to the delay network holding means 1, where it is stored. For the transformation of delay network, the CPU is provided with a pair of selective program files defining different transformation procedures as described below.

Figure 8:
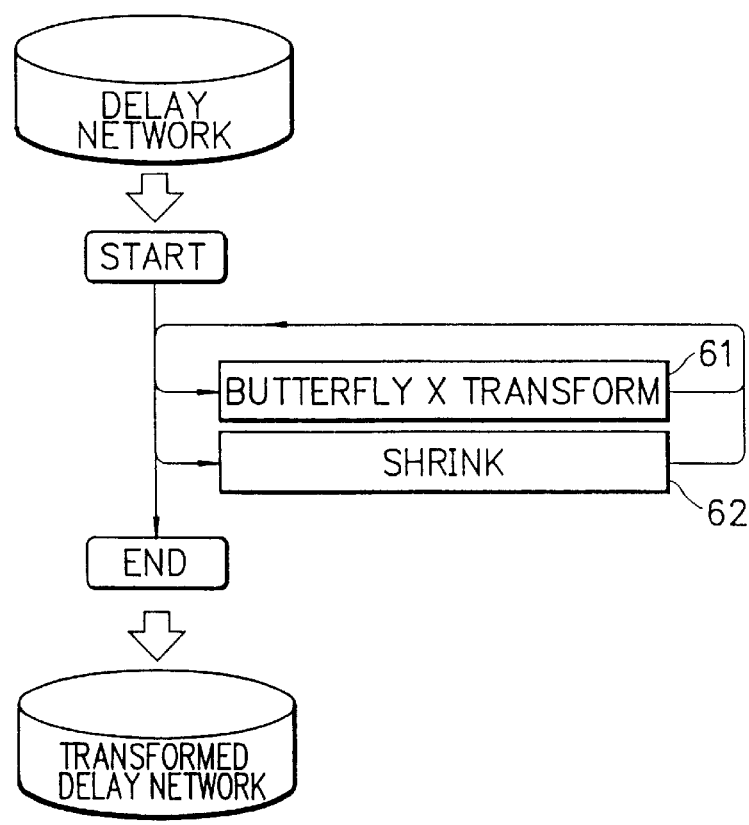
FIG. 8 is a flow chart of a transform process of the delay network transform means of the processor of FIG. 3.

FIG. 8 shows one transformation procedure for transforming an input delay network from the delay network hold means 1.

In FIG. 8, the procedure is given in a form of flow chart, as a delay network transform process comprising a butterfly X (i.e. butterfly-to-X: hereafter sometimes "B-X") transform routine 61 (shown in FIG. 6) and a shrink routine 62 (shown in FIG. 7), which routines 61 and 62 are continuously applicable in a voluntary order in a repeating manner if preset requirements for each of them are all met, or jump conditions thereto (i.e. later-described transform conditions) are all cleared.

Figure 6:
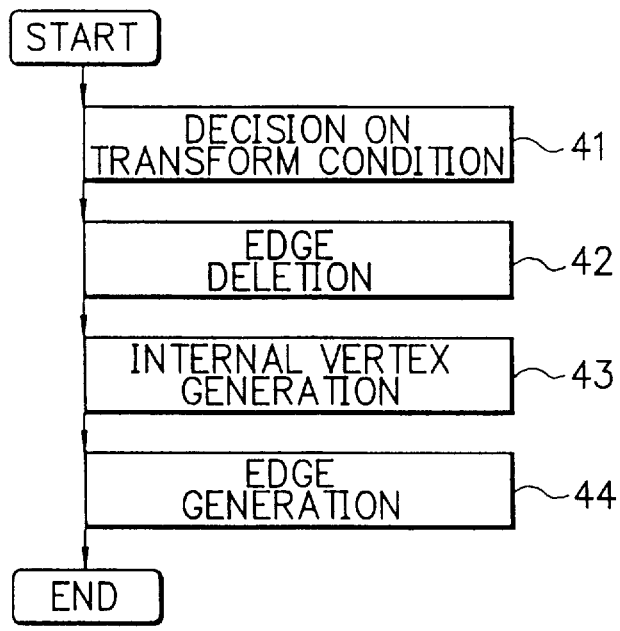
FIG. 6 is a flow chart of a butterfly X transform routine in a delay network transform means of the processor of FIG. 3.

FIG. 6 is a flow chart of the butterfly X transform routine, which comprises a transform condition decision step 41, a directional edge deletion step 42, an internal vertex generation step 43, and a directional edge generation step 44. Part of the decision step 41 belongs to the control program of FIG. 8, but is collectively shown in the routine of FIG. 6 for the conveniency of description. This routine will be first described.

Incidentally, in the CPU of FIG. 3, any edge is recognized as a flow graph (a,b) starting from a vertex "a" and ending at a vertex "b" and weighted with a weight W(a,b), where "a" and "b" are arbitrary identification characters of vertices.

As shown in FIG. 8, with the graphic data of delay network input, the delay network transform means 2 starts the transform process, and enters the butterfly X transform routine of FIG. 6, as it interrupts the program flow in response to a command of the CPU when below-described three conditions ①–③ for butterfly X transform are all met.

① A pair of sets Vs and Vt of vertices v and u are detected without intersection, such that:

$$Vs=\{vi\} \text{ and } Vt=\{uj\},$$

where i and j are identification nummerals of the vertices v and u such that $1 \leq i \leq K$ and $1 \leq j \leq L$, respectively, where K and L are arbitrary integers larger than one, respectively. The set Vs may contain a total of K source or internal vertices vi, and the set Vt may contain a total of L internal or sink vertices uj.

② A directional edge (vi,uj) is found between each vertex vi in the set Vs (∋vi) and each vertex uj in the set Vt (∋uj).

③ A weight equation is concluded between an arbitrary pair of vertices vi1 and vi2 in the set Vs (∋vi1, vi2) and an arbitrary pair of vertices uj1 and uj2 in the set Vt (∋uj1, uj2), such that:

$$W(vi1,uj1)+W(vi2,uj2) = W(vi1,uj2)+W(vi2,uj1).$$

Then, at the step 41, the sets Vs and Vt of vertices v and u and a set of a total of K×L directional edges (vi,uj) with weights W(vi,uj) are elementwise acknowledged.

Then, at the step 42, the acknowledged K×L directional edges (vi,uj) are deleted.

Then, at the step 43, an internal vertex w is generated, i.e. a new single vertex w is created.

Finally, at the step 44, there are generated: a new set of a total of K weighted directional edges extending from the acknowledged K vertices vi (∈Vs) to the generated internal vertex w, such that:

$$(v1, w), (v2, w), \ldots, (vi, w), \ldots, (vK, w); \text{ and}$$

a new set of a total of L weighted directional edges extending from the generated internal vertex w to the acknowledged L vertices uj (∈Vt), such that:

(w, u1), (w, u2), . . . , (w, uj), . . . , (w, uL), with their weights set such that:

$W(vi,w)=W(vi,u1)-W(v1,u1)$ for each $i$, and $W(w,uj)=W(v1,uj)$ for each $j$.

Therefore, in the B-X (butterfly X) transform routine, a total of K×L weighted directional edges connecting a total of K (source or internal) vertices to a total of L (internal or sink) vertices are replaced by (deleting the same and generating) a single internal vertex w and a total of K+L weighted directional edges extending from the K vertices to the internal vertex w or from the internal vertex w to the L vertices.

In this respect, when a given directional graph is topologically deformed by the B-X transform, if a directional edge (vi,uj) having connected one element vi of a vertex set Vs directly to one element uj of a vertex set Vt in the given graph is deleted from a deformed graph, there is necessarily found in the deformed graph a path which extends from that element vi of the vertex Vs via a new internal vertex w to this element uj of the vertex set Vt and in which a sum of weights W(vi,w) and W(w,vj) of directional edges (vi,w) and (w,uj) equals a weight W(vi,uj) that the deleted edge (vi,uj) had.

Like this, the B-X transform assures adequate delay information of a target logic circuit to be kept so long as the B-X transform conditions ①–③ are met.

The B-X transform increases a total number of internal vetices of an input delay network by a mere unity, but decreases a total number of directional edges thereof by as many as (K×L)–(K+L), which results in an effectively reduced number of directional edges connecting to a respective one of the K vertices and L vertices, providing a favorable effect to the shrink routine.

Figure 16:
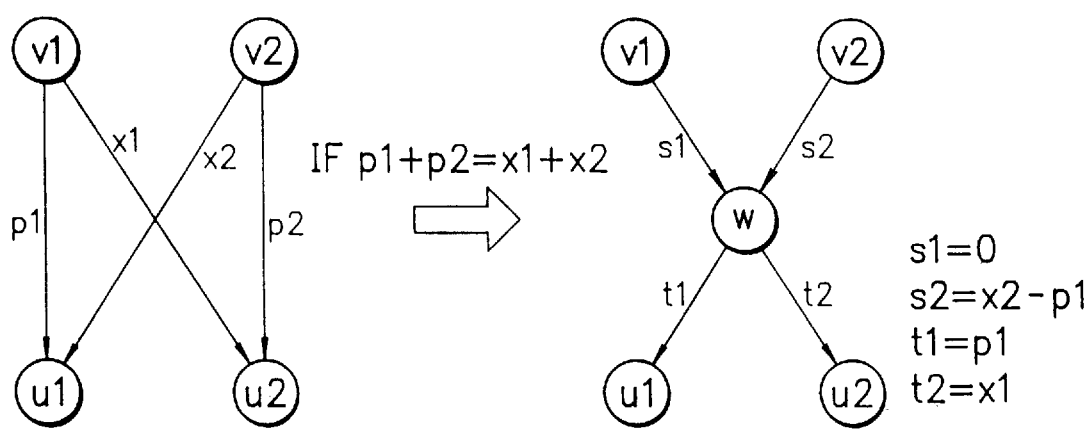
FIG. 16 is an example of a butterfly X transform by the routine of FIG. 6.

FIG. 16 illustrates a principle of the B-X transform in a comprehensive manner.

In FIG. 16, the set Vs={v1,v2 } and the set Vt={u1,u2 }. The set Vt has no intersection with the Vs. i.e. (Vs∩Vt)=0 or $Vs^c$ (c: complement) ⊇ Vt or Vs ⊆ $Vt^c$. Vertex v1 may be far from or very close to vertex v2 in an input delay network, like vertex u1 to vertex u2 therein, as the numerals 1 and 2 are no more than ids. For a conveniencee of illustration, weights of directional edges are defined simply by their values noted aside the edges, without ids of associated vertices.

In a left graph of FIG. 16, a single directional edge connects each element of the set Vs ={v1,v2 } to each element of the set Vt={u1,u2 } . Such edges are four in total, i.e. (v1,u1), (v1,u2), (v2,u1) and (v2,u2).

If a sum p1+p2 of weights p1 and p2 of the directional edges (v1,u1) and (v2,u2) equals a sum x1+x2 of weights x1 and x2 of the directional edges (v1,u2) and (v2,u1), then the B-X transform conditions are all met so the B-X routine transforms the left graph of FIG. 16 into a right graph in which the four edges (v1,u1), (v1,u2), (v2,u1) and (v2,u2) are deleted, a single internal vertex w is generated, and four new directional edges (v1,w), (v2,w), (w,u1) and (w,u2) are generated, with their weights s1, s2, t1 and t2 set such that:

$s1=W(v1,w)=W(v1,u1)-W(v1,u1)=0$ for $i=2$, $s2=W(v2, w)=W(v2, u1)-W(v1, u1)=x2-p1$ for $i=2$, $t1=W(w,u1)=W(v1,u1)=p1$ for $j=1$, and $t2=W(w,u2)=W(v1,u2)=x1$ for $j=2$.

Figure 7:
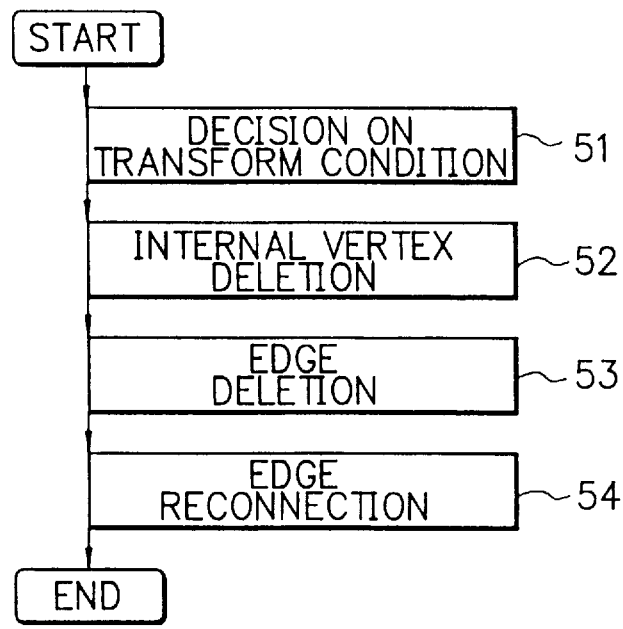
FIG. 7 is a flow chart of a shrink routine in the delay network transform means of the processor of FIG. 3.

FIG. 7 is a flow chart of the shrink (hereafter sometimes "Y–V" (i.e. Y-to-V [transform])) routine in the transform process of FIG. 8, which routine comprises a transform condition decision step 51, an internal vertex deletion step 52, a directional edge deletion step 53, and an edge reconneciton step 54. Part of the decision step 51 belongs to the control program of FIG. 8, but is collectively shown in the routine of FIG. 7 for the conveniency of description. This routine will be described below.

The Y–V routine of FIG. 7 interrupts the program flow of the control program of FIG. 8, in response to a command of the CPU when such a shrink condition (i.e. Y–V transform condition) is met that:

"an internal vertex v0 (which should have at least one directional edge ending thereon and at least one directional edge starting therefrom) has (two or more directional edges ending thereon and) a single directional edge starting therefrom" or "an internal vertex v0 has a single directional edge ending thereon (and two or more directional edges starting therefrom)", that is:

"when a total set {(vi,v0), (v0,uj)} of three or more (K+L≧3) directional edges {(vi,v0); vi∈Vs, 1≦i≦K}, {(v0, uj); uj∈Vt, 1≦j≦L} connected to an internal vertex v0 has only one element (v1,v0) or (v0,u1) thereof starting from or ending at the internal vertex v0", whereas the sets Vs and Vt follow the definition in condition ① of the Y–V transform, or in other words:

"when K=1 and L≧2 or when K≧2 and L=1" in a total set of directional edges {(vi,v0); vi∈Vs, 1≦i≦K} and {(v0,uj); uj∈Vt, 1≦j≦L} connected to an internal vertex v0.

Then, at the step 51, the sets Vs and Vt of vertices vi and uj and the set of K+L directional edges (vi,v0), (v0,uj) with weights W(vi,v0), W(v0,uj) are elementwise acknowledged, as well as the internal vertex v0.

Then, at the step 52, the acknowledged internal vertex v0 is deleted.

Then, at the step 53, the acknowledged K+L directional edges (vi,v0), (v0,uj) are deleted.

Finally, at the step 54, there are generated: a new set of a total of L (if K=1) weighted directional edges extending from an acknowledged vertex v1 (∈Vs) to the L acknowledged vertices uj (∈Vt), such that:

(v1,u1), (v1,u2), . . . ,(v1,uj), . . . ,(v1,uL); or a new set of a total of K (if L=1) weighted directional edges extending from the K acknowledged vertices vi (∈Vs) to an acknowledged vertex u1 (∈Vt), such that:

(v1, u1), (v2, u1), . . . , (vi, u1), . . . , (vK, u1), with their weights set such that:

$W(v1,uj)=W(v1,v0)+W(v0,uj)$ for each $j$, or $W(vi,u1)=W(vi,v0)+W(v0,u1)$ for each $i$.

In other words, at the step 54, the L (if K=1) or K (if L=1) directional edges each having had either endpoint (starting point or ending point) thereof on the internal vertex v0 (deleted in the step 52) are reconnected to the acknowledged vertex v1 or u1, with their weights varied.

Accordingly, if K+L directional edges {(vi,v0) }, {(v0,uj) } connected to an internal vertex v0 of an input delay network have only one (v1,v0) or (v0,u1) thereof starting from or ending at the vertex v0", then the Y–V routine deletes this vertex v0 and the "one edge (v1,v0) or (v0,u1)", changes weights of the remaining L or K edges (by adding a weight of the deleted edge), and reconnect free ends of the L or K edges to vertex v1 or u1.

In the Y–V transform, a sum of weights of two old directional edges on a route having extended from a vertex v1 via an internal vertex v0 to any of L vertices uj (or on a route having extended from any of K vertices vi via the internal vertex v0 to a vertex u1) is equivalent to a weight of a new directional edge connecting the vertex v1 to a corresponding one of the L vertices uj (or of a new directional edge connecting a corresponding one of the K vertices vi to the vertex u1).

Like this, the Y–V transform also assures adequate delay information of a target logic circuit to be kept so long as the Y–V transform condition is met.

The Y–V transform decreases a total number of internal vertices in an input delay network by one, and a total number of directional edges therein by one, so that the delay network is shrinked.

Figure 17A:
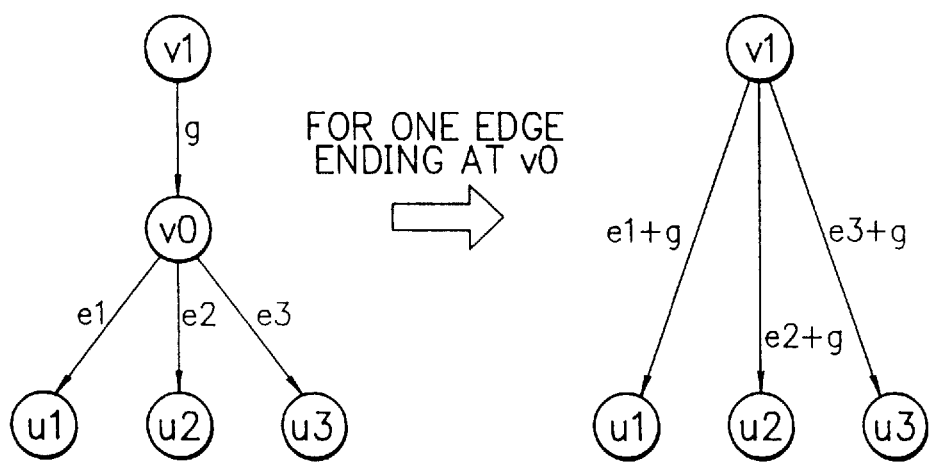
FIGS. 17A and 17B are examples of a shrinking by the routine of FIG. 7.

FIG. 17A shows an example of the Y–V transform.

In FIG. 17A, the set Vs={v1} and the set Vt={u1, u2,u3}, so K=1 and L=3. (Vs∩Vt)=0.

In a left graph of FIG. 17A, a single directional edge (v1,v0) ends at an internal vertex v0. The vertex v0 is not contained in the set Vs nor Vt, so {v0} ∩(Vs∪Vt)=0 or v0∈(Vs$^c$∩Vt$^c$). The Y–V transform condition is met. Four directional edges (v1,v0), (v0,u1), (v0,u2) and (v0,u3) have their weights g, e1, e2 and e3.

Accordingly, the left graph is Y–V transformed to a right graph of FIG. 17A, where three new directional edges (v1,u1), (v1,u2) and (v1,u3) have their weights e1+g, e2+g and e3+g.

Figure 17B:
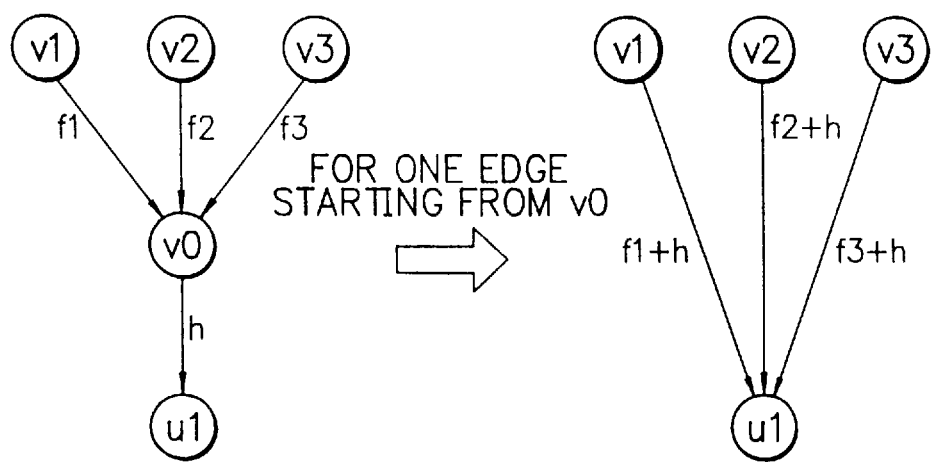

FIG. 17B is another example of the Y–V transform.

In FIG. 17B, Vs={v1,v2,v3} and Vt={u1}, so K=3 and L=1. (Vs∩Vt)=0.

In a left graph of FIG. 17B, a single directional edge (v0,u1) starts from an internal vertex v0∈(Vs$^c$∩Vt$^c$). The Y–V transform condition is met. Four directional edges (v1,v0), (v2,v0), (v3,v0) and (v0,u1) have their weights f1, f2, f3 and h.

Accordingly, the left graph is Y–V transformed to a right graph of FIG. 17B, where three new directional edges (v1,u1), (v2,u1) and (v3,u1) have their weights f1+h, f2+h and f3+h.

The transform process shown in FIG. 8 comprises an arbitrary combination of the B-X and Y–V transform routines, in which the B-X transform and the Y–V transform are continuously repeatable in a voluntary order unless their transform conditions are cleared.

Neither the B-X transform nor the Y–V transform increases a total number of directional edges that have their weights representing delay data of a target logic circuit, so any combination or repetition thereof assures a progressive concision of an original delay network, with an effective reduction in topological redundancy of the delay data to be held for a delay computation of the target circuit.

The B-X transform as well as the Y–V transform can solely serve for a topological redundancy reduction, subject to the transform conditions that may be seldom met in application to an insufficiently transformed delay network or will not be met even in application to an original delay network. For example, the Y–V transform is inapplicable to the original delay network shown in FIG. 14, before the B-X routine transforms this network to permit such an application.

In this respect, the proposed use of an arbitrary combination of B-X transform and Y–V transform provides the possibility of a sufficient reduction in redundancy of delay data structure.

Like this, the delay network transform means 3 of FIG. 3 permits an effective reduction in quantity of delay data as well as in complexity of delay network. That is, both redundant delay-time data and graphic data are reduced. The original delay network generated by the delay network generation means 2 has a substantially identical order of data quantity to a conventional case, but the data quantity is effectively reduced through the delay network transform means 3 so that the delay network hold means 1 can save a significant area of memory region.

Figure 18:
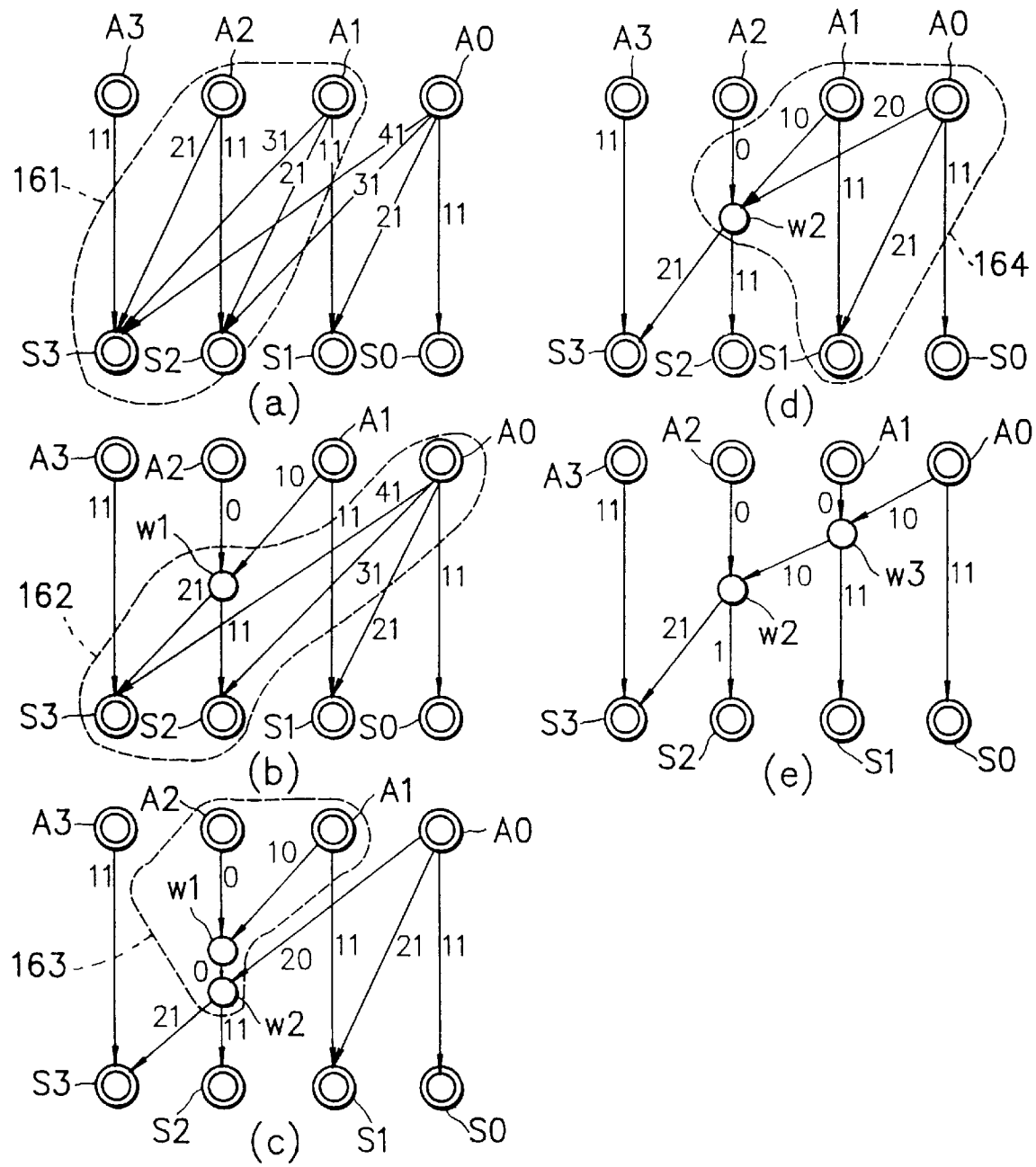
FIG. 18 is an example of a combined transform by the process of FIG. 8.

FIG. 18 illustrates a progress of transformation in which the original redundant delay network of FIG. 14 is stepwise transformed into a redundancy-free state by the transform process of FIG. 8.

As shown in FIG. 18, at a step (a), the original redundant delay network is input to the delay network transform means 3, where it has in a region 161 several graphic components thereof acknowledged as objects meeting the B-X transform conditions, i.e. Vs={A2, A1}, Vt={S3, S2} and a set of directional edges {(A2,S3), (A2,S2), (A1,S3), (A1, S2)} with a meeting weight relationship (21+21=11+31).

As a result, at a step (b), the graphic components acknowledged in the step (a) are B-X transformed to have a new internal vertex w1 and four new directional edges (A2,w1), (A1,w1), (w1,S3) and (w1,S2) with their weights "0", "10", "21" and "11".

Then, at the step (b), there are acknowledged in a region 162 several graphic components meeting the B-X transform conditions, i.e. Vs {w1, A0} , Vt={S3, S2} and a set of directional edges {(w1,S3), (w1,S2), (A0,S3), (A0,S2)} with a meeting weight relationship (21+31=41+11).

As a result, at a step (c), the graphic components acknowledged in the step (b) are B-X transformed to have a new internal vertex w2 and four new directional edges (w1,w2), (A0,w2), (w2,S3) and (w2,S2) with their weights "0", "20", "21" and "11".

Then, at the step (c), there are acknowledged in a region 163 several graphic components meeting the Y–V transform condition, i.e. Vs={A2, A1}, v0=w1, Vt={w2} and a set of directional edges {(A2,w1), (A1,w1), (w1,w2)} with their weights "0", "10" and "0".

As a result, at a step (d), the graphic components acknowledged in the step (c) are Y–V transformed to have two new directional edges (A2,w2) and (A1,w2) with their weights "0" and "10".

Then, at the step (d), there are acknowledged in a region 164 several graphic components meeting the B-X transform conditions, i.e. Vs={A1, A0}, Vt={w2, S1} and a set of directional edges {(A1,w2), (A1,S1), (A0,w2), (A0,S1)} with a meeting weight relationship (10+21=20+11).

As a result, at a step (e), the graphic components acknowledged in the step (d) are B-X transformed to have a new internal vertex w3 and four new directional edges (A1,w3), (A0,w3), (w3,w2) and (w3,S1) with their weights "0", "10", "10" and "11", whereby the redundancy-free state is achieved.

Figure 12:
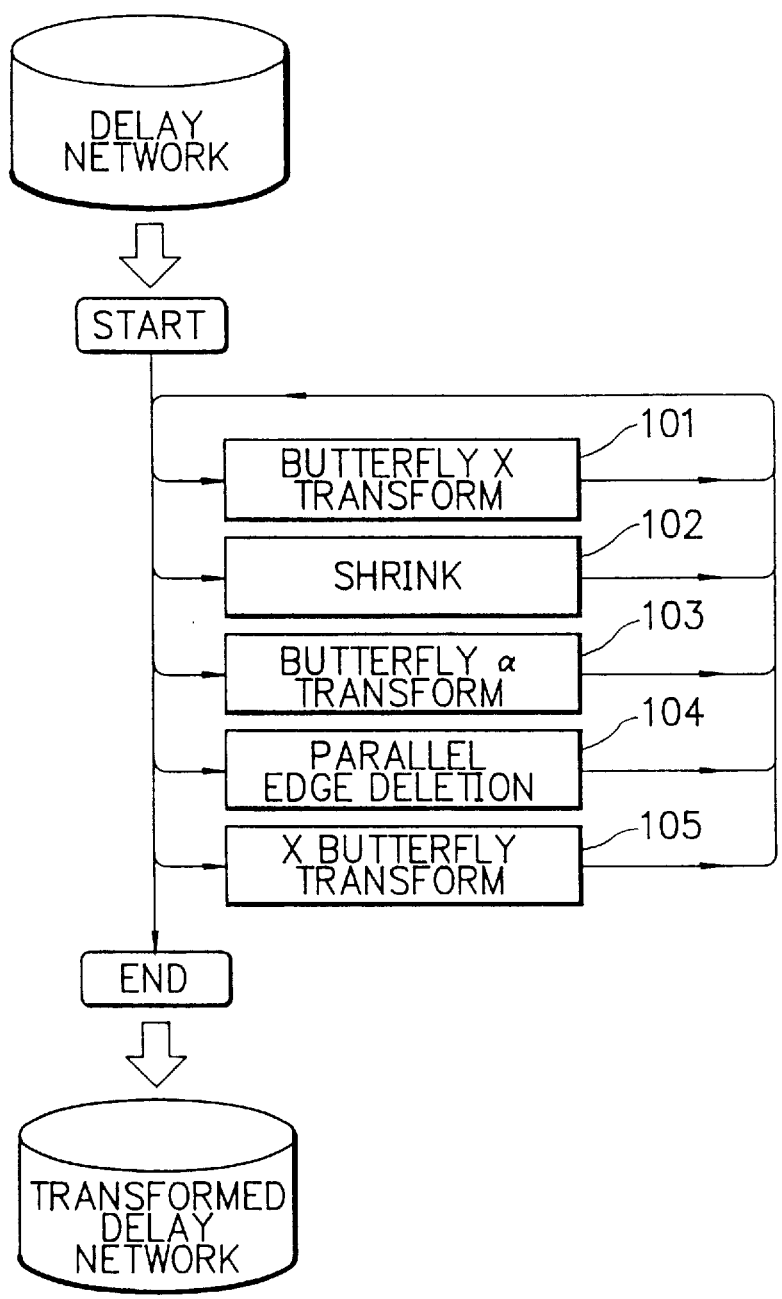
FIG. 12 is a flow chart of another transform process of the delay network transform means of the processor of FIG. 3.

FIG. 12 shows the other transformation procedure for transforming an input delay network from the delay network hold means 1 of FIG. 3.

Figure 10:
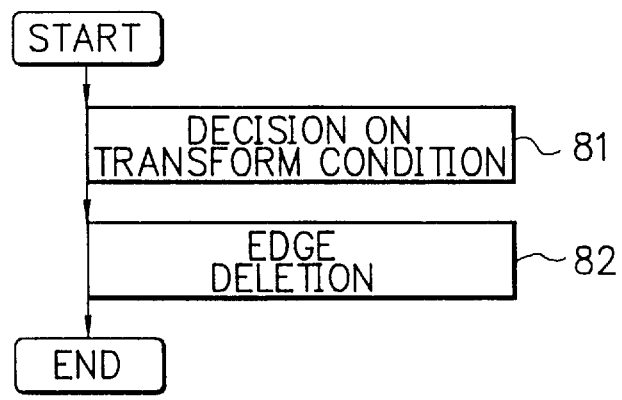
FIG. 10 is a flow chart of a parallel edge deletion routine in the delay network transform means of the processor of FIG. 3.
Figure 11:
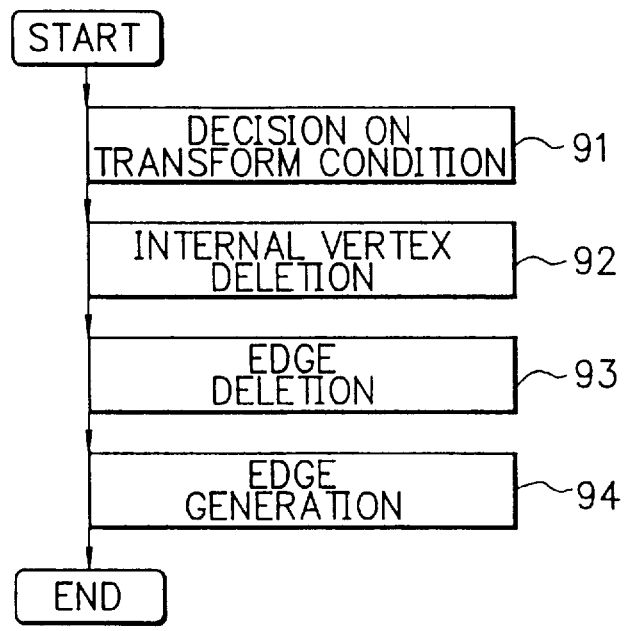
FIG. 11 is a flow chart of an X butterfly transform routine in the delay network transform means of the processor of FIG. 3.

In FIG. 12, the procedure is given in a form of flow chart, as another delay network transform process that comprises a butterfly X (i.e. B-X) transform routine 101 (shown in FIG. 6), a shrink (i.e. Y–V [transform]) routine 102 (shown in FIG. 7), a butterfly a (hereafter sometimes "B-α" (butterfly-to-α)) transform routine 103 (shown in FIG. 9), a parallel edge deletion (hereafter sometimes "II-I" (II-to-I [transform])) routine 104 (shown in FIG. 10), and an X butterfly (hereafter sometimes "X-B" (X-to-B)) transform routine 105 (shown in FIG. 11).

In the delay network transform process, the butterfly X (B-X) transform routine 101, the shrink (Y–V transform) routine 102, the butterfly a (B-α) transform routine 103 and the parallel edge deletion (II-I transform) routine 104 are continuously applicable in a voluntary order in a repeating manner until preset requirements for each of them are all met or jump conditions thereto (i.e. transform conditions thereof) are all cleared. Then, the X butterfly (X-B) transform routine 105 becomes applicable.

After this X-B transform, conditions of the B-X, Y–V, B-α and II-I transform routines are again examined.

Then, applicable routines are repeatably executed in an arbitary order, until little reduction of data (in number of vertices or edges) is observed or X-B transform conditions are cleared, when the transform process has come to an end, with a sufficient data reduction achieved.

Figure 9:
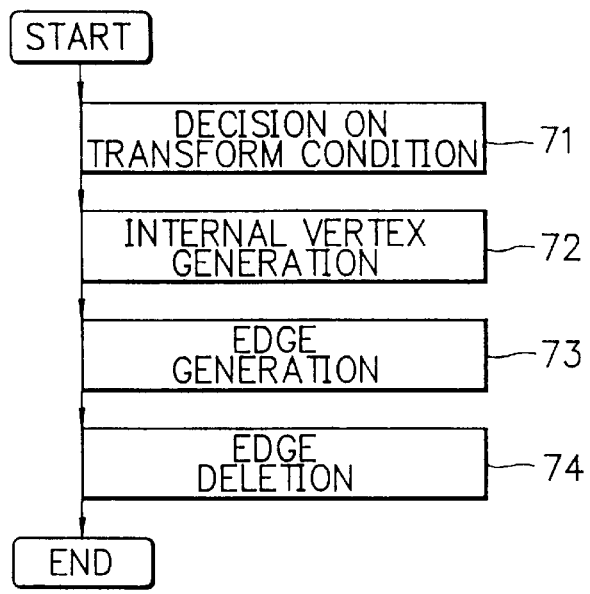
FIG. 9 is a flow chart of a butterfly α transform routine in the delay network transform means of the processor of FIG. 3.

FIG. 9 is a flow chart of the B-α (butterfly α) transform routine, which comprises a transform condition decision step 71, an internal vertex generation step 72, a directional edge generation step 73 and a directional edge deletion step 74. Part of the decision step 71 belongs to a control program of FIG. 12, but is collectively shown in the routine of FIG. 9 for convenience of description. This routine will be first described.

As shown in FIG. 12, with the graphic data of delay network input, the delay network transform means 3 starts the transform process, and enters the B-a transform routine of FIG. 9, as it interrupts the program flow in response to a command of the CPU when below-described two conditions ①, ② for the B-α transform are met.

①A pair of sets Vs and Vt of vertices v and u are detected without intersection, such that:

$$Vs=\{vi\} \text{ and } Vt=\{uj\},$$

where i and j are identification nummerals of the vertices v and u such that $1 \leq i \leq K$ and $1 \leq j \leq L$, respectively, where K and L are arbitrary integers larger than one, respectively. The set Vs may contain a total of K source or internal vertices vi, and the set Vt may contain a total of L internal or sink vertices uj.

②A directional edge (vi,uj) is found between each vertex vi in the set Vs (∋vi) and each vertex uj in the set Vt (∋uj).

Then, at the step 71, the sets Vs and Vt of vertices v and u and a set of a total of K×L directional edges (vi,uj) with weights W(vi,uj) are elementwise acknowledged.

Then, at the step 72, an internal vertex w is generated, i.e. a new single vertex w is created.

Then, at the step 73, there are generated: a new set of a total of K weighted directional edges extending from the acknowledged K vertices vi (∈Vs) to the generated internal vertex w, such that:

$$(v1, w), (v2, w), \ldots, (vi, w), \ldots, (vK, w); \text{ and}$$

a new set of a total of L weighted directional edges extending from the generated internal vertex w to the acknowledged L vertices uj (∈Vt), such that:

$$(w, u1), (w, u2), \ldots, (w, uj), \ldots, (w, uL),$$

with their weights set such that:

$$W(vi,w)+W(w,uj) \leq W(vi,uj) \text{ for each } i \text{ each } j,$$

which inequality will be called "B-α weight setting expression".

Finally, at the step 74, the acknowledged K×L directional edges (vi,uj) are deleted, subject to:

$$W(vi,w)+W(w,uj)=W(vi,uj),$$

which equality will be called "B-α edge deletion condition expression".

Therefore, the B-α transform routine, as it has acknowledged a total of K×L weighted directional edges connecting a total of K (source or internal) vertices individually to a total of L (internal or sink) vertices, first generates a single internal vertex w and a total of K+L weighted directional edges (i.e. new K edges connecting the K vertices to the new vertex w and new L edges connecting the new vertex w to the L vertices) with weights meeting the B-α weight setting expression, and then deletes those of the acknowledged K×L directional edges which meet the B-α edge deletion condition expression.

Accordingly, in the B-α transform routine, when a given directional graph is topologically deformed, if a directional edge (vi, uj) having connected an associated element vi of a vertex set Vs directly to an associated element uj of a vertex set Vt in the given graph is deleted from a deformed directional graph, there is necessarily found in the deformed graph a path which extends from the associated element vi of the vertex set Vs via a new internal vertex w to the associated element uj of the vertex set Vt and in which a sum of weights W(vi,w) and W(w,uj) of directional edges (vi,w) and (w,uj) equals a weight W(vi,uj) that the deleted edge (vi,uj) had.

If a directional edge (vi,uj) having connected one element vi of the vertex set Vs directly to one element uj of the vertex set Vt in the given graph is not deleted from the deformed directional graph, i.e. if it is again found in the deformed graph, it necessarily has a weight W(vi,uj) larger than a sum of weights W(vi,w) and W(w,uj) of directional edges (vi,w) and (w,uj) in a new single path which extends from that element vi of the vertex set Vs via the internal vertex w to this element uj of the vertex set Vt.

Like this, the B-α transform assures adequate delay information of a target logic circuit to be kept so long as the B-α transform conditions ①② are met.

The B-α transform increases a total number of internal vetices of an input delay network by a mere unity, but decreases a total number of directional edges thereof by at most (K×L)–(K+L+1), which may result in an effectively reduced number of directional edges connecting to each associated element of the sets Vs and Vt, providing a favorable effect to the shrink routine. The effect may depend on a selection of elements of the sets Vs and Vt, and may be adverse in number of edges or that per vertex.

The B-α transform conditions are less severe as a whole than the B-X transform conditions, so may be applicable to an increased number of local graphs, while the B-X transform permits a larger number of directional edges to be deleted.

Figure 19:
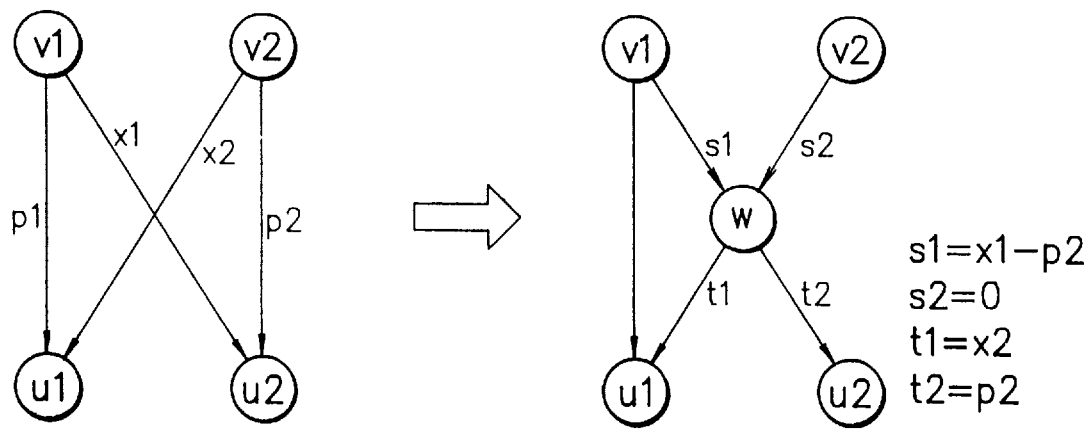
FIG. 19 is an example of a butterfly α transform by the routine of FIG. 9.

FIG. 19 illustrates a principle of the B-α transform in a comprehensive manner.

In FIG. 19, the set Vs={v1,v2 }, and the set Vt={u1,u2 }. (Vs∩Vt)=0.

In a left graph of FIG. 19, a single directional edge connects each element of the set Vs={v1,v2 } to each element of the set Vt={u1,u2 }. Such edges are four in total, i.e. (v1,u1), (v1,u2), (v2,u1) and (v2,u2).

As the the B-α transform conditions are met, the B-α routine transforms the left graph of FIG. 19 into a right graph in which a single internal vertex w is generated, four new directional edges (v1,w), (v2,w), (w,u1) and (w,u2) are generated, and three (v1,u2), (v2,u1) and (v2,u2) of the old four edges are deleted by setting weights s1, s2, t1 and t2 of the new edges such that:

$$s1=W(v1,w)=x1-p2,$$

$$s2=W(v2,w)=0,$$

$$t1=W(w,u1)=x2, \text{ and}$$

$$t2=W(w,u2)=p2.$$

FIG. 10 is a flow chart of the II-I (parallel edge deletion) transform routine in the transform process of FIG. 12, which routine comprises a transform condition decision step 81 and a directional edge deletion step 82. Part of the decision step 81 belongs to the control program of FIG. 12, but is collectively shown in the routine of FIG. 10 for the conveniency of description. This routine will be described below.

The II-I transform routine of FIG. 10 interrupts the program flow of the control program of FIG. 12, in response to a command of the CPU when such a transform condition is met that:

"a single element set Vs={v} of a source or internal vertex and another single element set Vt={u} of an internal or sink vertex are connected with each other by a plurality of directional edges (u,v)".

Then, at the step 81, the sets Vs and Vt of vertices v and u and the directional edges (v,u) with weights W(u,v) are elementwise acknowledged.

Then, at the step 82, the acknowledged directional edges (u,v) are deleted, except one that has a largest weight.

In the II-I transform, therefore, when a plurality of directional edges are found each ending at both endpoints thereof on a pair of vertices, they are all deleted but one.

The II-I transform thus deletes extra directional edges on a delay network. As a result, at each associated vertex, the number of directional edges connected thereto is reduced, so that a number of interval vertices meeting the Y–V transform may be increased.

Figure 20:
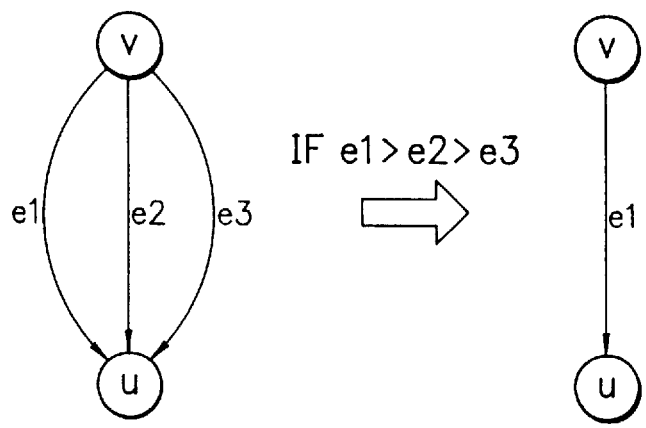
FIG. 20 is an example of a parallel edge deletion by the routine of FIG. 10.

FIG. 20 shows an example of the II-I transform.

In a left graph of FIG. 20, there are observed three directional edges (u,v) with their weights e1>e2>e3, between two vertices v and u. In a right graph, two of the three directional edges are deleted, leaving one that has the largest weight e1.

FIG. 11 is a flow chart of the X-B (X butterfly) transform routine, which comprises a transform condition decision step 91, an internal vertex deletion step 92, a directional edge deletion step 93 and a directional edge generation step 94. Part of the decision step 91 belongs to a control program of FIG. 12, but is collectively shown in the routine of FIG. 11 for the conveniency of description. This routine will be described.

As shown in FIG. 12, with the graphic data of delay network input, the delay network transform means 3 starts the transform process, where the B-X, Y–V, B-α and II-I transform get completed with their transform conditions cleared in due course, then the flow enters the X-B transform routine of FIG. 11, as it interrupts the program flow in response to a command of the CPU when below-described two conditions ①, ② for the X-B transform are met.

① A pair of sets Vs and Vt of vertices v and u are detected without intersection, such that:

$$Vs=\{vi\} \text{ and } Vt=\{uj\},$$

where i and i are identification numerals of the vertices v and u such that $1 \leq i \leq K$ and $1 \leq j \leq L$, respectively, where K and L are arbitrary integers larger than one, respectively. The set Vs may contain a total of K source or internal vertices vi, and the set Vt may contain a total of L internal or sink vertices uj.

② An internal vertex w is present, and a total of K directional edges (vi,w) are found starting elementwise from the vertex set Vs and all ending at the vertex w, besides a total of L directional edges (w,uj) all starting from the vertex w and elementwise ending on the vertex set Vt. No directional edges connect the vertex w to other vertices than the sets Vs and Vt.

Then, at the step 91, the sets Vs and Vt of vertices v and u and a set of a total of K+L directional edges (vi,w) and (w,uj) with weights W(vi,w) and W(w,uj) are elementwise acknowledged, as well as the internal vertex w.

Then, at the step 92, the acknowledged internal vertex w is deleted.

Then, at the step 93, there are deleted: the K acknowledged directional edges having extended from the acknowledged K vertices vi (∈Vs) to the deleted internal vertex w:

$$(v1,w), (v2,w), \ldots, (vi,w), \ldots, (vK,w); \text{ and}$$

the L acknowledged directional edges having extended from the deleted internal vertex w to the acknowledged L vertices uj (∈Vt):

$$(w, u1), (w, u2), \ldots, (w, uj), \ldots, (w, uL),$$

Finally, at the step 94, there are generated a total of K×L new directional edges (vi,uj) connecting each element of the vertex set Vs to each element of the vertex set Vt, with their weights set such that:

$$W(vi,uj)=W(vi,w)+W(v,uj) \text{ for each } i \text{ each } j.$$

Therefore, in the X-B transform routine, a total of K directional edges connecting K (source or internal) vertices to a single internal vertex w and a total of L directional edges connecting the internal vertex w to L (internal or sink) vertices are deleted together with the internal vertex w, and a total of K×L directional edges extending from the K vertices to the L vertices are generated.

The X-B transform is an inverse transform of the B-X transform, so it decreases a total number of internal vertices by a unity and increases a total number of directional edges by (K×L)−(K+L), which is a null if K=L=2.

The X-B transform may be considered as a double Y–V transform.

In the process of FIG. 12, a combined application of the B-X, Y–V, B-α and II-I transform may lead to a local optimum solution (where their transform conditions are all cleared notwithstanding a possibility of a better concision), wherefrom one may go out by an application of the X-B transform.

In other words, the X-B transform may be applied to a local graph to induce a relaxed state where transform conditions of B-X, Y-V, B-α and/or II-I may be met, permitting one to slip out the local optimum state to approach the better concision.

After such the slip-out, there may be a case no applications of B-X, Y-V, B-α and II-I transform can successfully render the delay network more concise.

Figure 21:
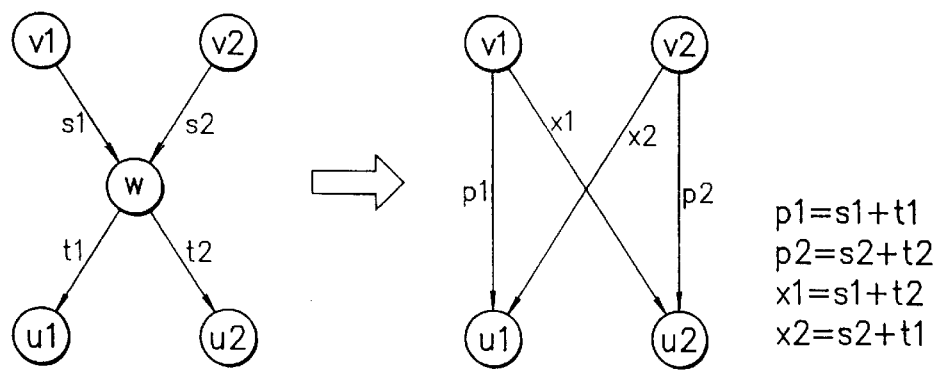
FIG. 21 is an example of an X butterfly transform by the routine of FIG. 11.

In this case, the delay network should be returned to a previous state relative to the X-B transform, where the process of FIG. 12 has come to an end, FIG. 21 illustrates a principle of the X-B transform in a comprehensive manner.

In FIG. 21, the set Vs={v1,v2 }, and the set Vt={u1,u2}. (Vs∩Vt)=0.

In a left graph of FIG. 21, two directional edges (v1, w) and (v2,w) connect Vs to a single internal vertex w, and two directional edges (w,u1) and (w,u2) connect the internal vertex w to Vt. The directional edges have their weights s1, s2, t1, t2.

As the the X-B transform conditions are met, the X-B routine transforms the left graph of FIG. 21 into a right graph in which the four edges (v1,w), (v2,w), (w,u1) and (w,2) are deleted together with the internal vertex w is, and four new directional edges (v1,u1), (v1,u2), (w,u1) and (w,u2) are generated, with their weights set such that:

$p1=W(v1,u1)=s1+t1,$ $p2=W(v2,u2)=s2+t2,$ $x1=W(v1,u2)=s1+t2,$ and $x2=W(v2,u1)=s2+t1.$ The foregoing B-a transform (FIG. 9), II-I transform (FIG. 10) and the X-B transform (FIG. 11) are combined with the B-X transform (FIG. 6) and the Y-V transform (FIG. 7) to constitute the process of FIG. 12.

In FIG. 12, as described, the B-X transform routine 101, the Y-V transform routine 102, the B-α transform routine 103 and the II-I transform routine 104 are continuously applicable in a voluntary order in a repeating manner until their transform conditions are all cleared. Then, the X-B transform routine 105 becomes applicable. After this X-B transform, conditions of the B-X, Y-V, B-a and II-I transform routines are examined. Then, applicable routines are executed in an arbitary order, until little reduction of data is observed or X-B transform conditions are cleared, when the transform process has come to an end.

The combination of B-X, Y-V, B-α and II-I transform routines, which are continuously applicable in a voluntary order, permits a delay network to be progressively processed up to a less redundant than by the process of FIG. 8.

Figures 22A, 22B, 22C:
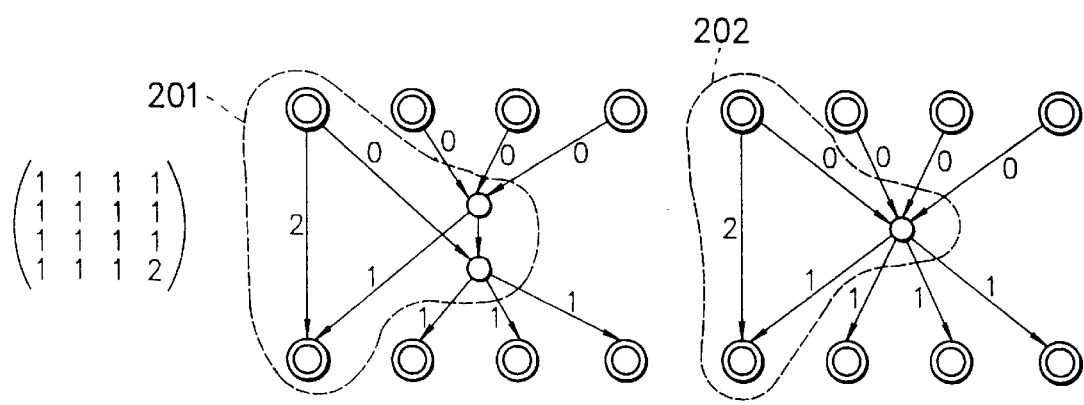
FIGS. 22A to 22C show a comparison between the process of FIG. 8 and the process of FIG. 12.

Moreover, the X-B transform routine effectively reduces a probability of an occasional occurrence of local optimum solution, FIGS. 22A to 22C illustrate a comparison between the transform process of FIG. 8 and the transform process of FIG. 12.

FIG. 22A shows a set of original delay data of a target logic circuit in a matrix form, from which an original delay network is generated.

FIG. 22B shows the original network, as it is transformed by the process of FIG. 8.

FIG. 22C shows the original network, as it is transformed by the process of FIG. 12.

The transformed network in FIG. 22B has a still redundant local graph in a region 201.

In the network of FIG. 22C, the redundant local graph is yet transformed by the B-α transform routine, as it is applied once, and the shrinkage, as it is applied twice, into a local graph shown in a correspondent region 202, where one directional edge and one internal vertex of FIG. 22B are deleted.

Incidentally, the transform process of FIG. 8 may preferably be modified by adding one or more of the B-α transform, the II-I transform and the X-B transform.

The transform processes of FIGS. 8 and 12 may preferably apply generalized transform rules to the B-X, II-I, Y-V, X-B and/or B-α transform routine(s), as the whole or part of the transform conditions may be unified thereunder to be employed as a programmable transform operator.

There will be described three generalized transform rules: a path communization rule, a path monopolization rule and a unified rule.

We have hitherto used the term "topological redundancy" without definition, as it has a subjective face of which a significancy depends on an algorithm in the architecture of an employed delay computation system.

For example, letting n and m be arbitrary integers such that n>m, typical system engineers may consider n-m directional edges should be less redundant than n directional edges, as some phrases herein have implied. But, some others will not, so long as the integers are arbitrary ones, because their systems may prefer n directional edges. Further, a few may consider n+m directional edges should be less redundant than n directional edges.

To this point, letting Ne be a total number of directional edges to be contained in a most adaptive directional graph to a concerned delay computation system, it is now assumed that a topological redundancy herein has a significancy Rs thereof defined such that:

$Rs=N-Ne,$ where N is a total number of directional edges contained in a concerned directional graph.

The significancy of topological redundancy (hereafter simply "redundancy") Rs may be a positive, a negative or a null.

The subject matter of the present invention resides in a presentation of implements for approaching or attaining an ideal state where Rs=0.

The path communization rule will be discussed below, with reference to FIG. 16.

If the following four conditions are met:

(A1) Rs≠0;

(A2) Vs∩Vt=0;

(A3) ∀vi∈Vs and ∀uj∈Vt →∃ a directional edge=(vi,uj); and (A4) ∀a∈{i} and ∀b∈{i}→∃c∈{j} and ∃d∈{j} such that W(va, uc)+W(vb, ud)=W(va, ud)+W(vb, uc), then there occurs:

(A5) deletion of (va,uc) and (vb,ud);

(A6) generation of a single internal vertex w;

(A7) generation of directional edges (va,w), (vb,w), (w,uc) and (w,ud) with weights such that W(va, w)+W (w, uc)=W(va, uc) and W(vb,w)+W(w,ud)=W(vb,ud).

This rule is similar to the B-X transform, but it is concluded even for K=1 (i.e. a=b) or L=1 (i.e. c=d).

Transform by this rule changes the total number (N) of directional edges such that ΔN=(K+L)-(K×L).

Accordingly, if K=1 or L=1, then ΔN>0.

If K=L=2, then AN=0.

In other cases (K≧2, L≧2 and K≠L), ΔN<0.

No change will be caused in the largest path length, i.e. a maximum one of sums of weights of directional edges in paths between vi and uj for each i each j.

The path monopolization rule will be discussed below, with reference to FIG. 21.

If the following five conditions are met:

(B1) $Rs \neq 0$;

(B2) $Vs \cap Vt = 0$, $w \in Vs^c$, $w \in Vt^c$;

(B3) $\forall vi \in Vs \rightarrow \exists$ a directional edge=(vi,w);

(B4) $\forall uj \in Vt \rightarrow \exists$ a directional edge=(w,uj); and (B5) $x \in (Vs \cup Vt)^c \rightarrow \{(x, w)\} \cup \{(w, x)\} = 0$, then there occurs:

(B6) deletion of w;

(B7) generation of directional edges (va,uc), (va,ud), (vb,uc) and (vb,ud) with weights such that W(va,uc)= W(va,w)+W(w,uc) and W(vb, ud)=W(vb, w)+W(w, ud), for $\forall a \in \{i\}$, $\forall b \in \{i\}$, $\forall c \in \{j\}$, $\forall d \in \{j\}$.

This rule is similar to the X-B transform, but it is concluded even for K=1 (i.e. a=b) or L=1 (i.e. c=d).

Transform by this rule changes the total number (N) of directional edges such that $\Delta N = (K \times L) - (K+L)$.

Accordingly, if K=1 or L=1, then $\Delta N < 0$.

If K=L=2, then $\Delta N = 0$.

In other cases ($K \geq 2$, $L \geq 2$ and $K \neq L$), $\Delta N > 0$.

No change will be caused in the largest path length between vi and uj for each i each j.

The path communization and monopolization rules constitute inverse transform rules to each other.

FIGS. 23A to 23D illustrate the unified rule.

The unified rule acts on any graph, unless Rs=0.

Figure 23A:
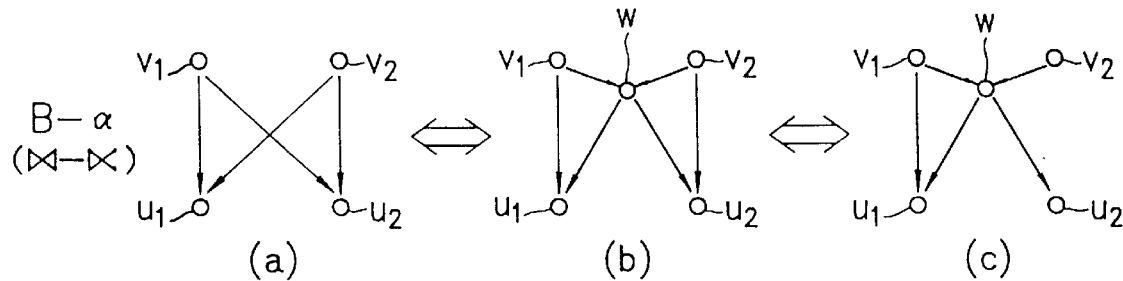
FIGS. 23A to 23D are graphs for describing a generalized rurle.
Figure 23B:
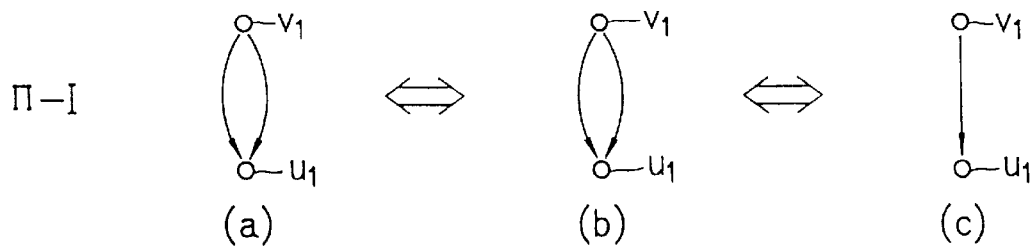
Figure 23C:
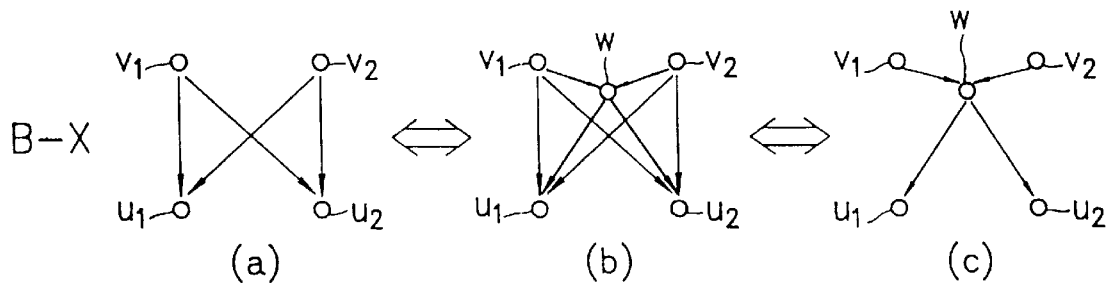
Figure 23D:
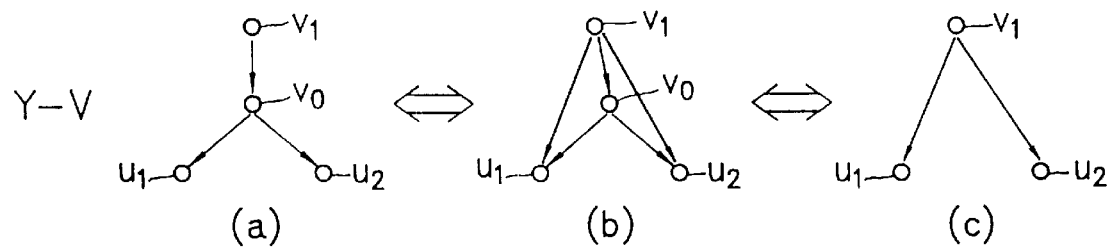

In the unified rule, an arbitrary pair of vertices vi and uj are permitted to have a new path additionally bridged therebetween (FIGS. 23A, 23C and 23D), provided that its weight length is smaller than the largest path length therebetween. Then, the weight length of the added path is increased by increasing weights of one or more associated edges in an arbitrary manner. When the weight length is equalized to the largest weight length, a better path is selected to approach the ideal state of Rs=0. Like operation may be executed between existing parallel paths (FIG. 23B).

In FIGS. 23A to 23D, each (a)-state changes via (b)-state to (c)-state, or vice versa. In the (b) state, there is observed a bridging (FIGS. 23A, 23C, 23D) or pseudo-bridging (23B).

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A system for processing data representing delays in a logic network, comprising:

a data holding means for holding a first set of graphic data representing a first delay network composed of:

a first set of vertices comprising a first vertex, a second vertex, a third vertex, and a fourth vertex, and a first set of weighted directional edges extending between elements of the first set of vertices and containing a first directional edge extending from the first vertex to the fourth vertex having a weight x1, a second directional edge extending from the second vertex to the third vertex having a weight x2, a third directional edge extending from the first vertex to the third vertex having a weight p1, and a fourth directional edge extending from the second vertex to the fourth vertex having a weight p2;

means for determining that the first set of delay data meets the condition (x1+x2)=(p1+p2); and a data processing means for processing the first set of graphic data to obtain a second set of graphic data representing a second delay network composed of:

a second set of vertices comprising the first vertex, the second vertex, the third vertex, the fourth vertex, and a fifth vertex not contained in the first set of vertices, and a second set of weighted directional edges extending between elements of the second set of vertices and containing a fifth directional edge extending from the first vertex to the fifth vertex having a weight of zero, a sixth directional edge extending from the second vertex to the fifth vertex having a weight (x2-p1), a seventh directional edge extending from the fifth vertex to the third vertex having a weight p1, and an eighth directional edge extending from the fifth vertex to the fourth vertex having a weight x1.

2. A delay data processing system according to claim 1, wherein an arbitrary one of the first to fourth directional edges extending between associated two of the first to fourth vertices in the first delay network is weighted by a first weight representing a delay therealong, wherein the associated two vertices have in the second delay network an edge route therebetween consisting of corresponding two of the fifth to eighth directional edges, and wherein the edge route has a total weight therealong equivalent to the first weight.

3. A delay data processing system according to claim 1, wherein the data holding means holds the second set of graphic data as the first set of graphic data.

4. A delay data processing system according to claim 1, wherein the data processing means is operable to process the second set of graphic data as the first set of graphic data.

5. A delay data processing system according to claim 1, wherein the first set of vertices contains:

a first concerned vertex;

a second concerned vertex;

a third concerned vertex; and a fourth concerned vertex, and the first set of weighted directional edges contains:

a first concerned edge extending from the first concerned vertex to the second concerned vertex;

a second concerned edge extending from the second concerned vertex to the third concerned vertex; and a third concerned edge extending from the second concerned vertex to the fourth concerned vertex, and wherein the data processing means is operable to process the first set of graphic data to obtain a third set of graphic data representing a third delay network composed of:

a third set of vertices containing:

the first concerned vertex, the third concerned vertex, and the fourth concerned vertex, and a third set of weighted directional edges extending between elements of the third set of vertices, the third set of weighted directional edges containing:

a ninth directional edge extending from the first concerned vertex to the third concerned vertex, and a tenth directional edge extending from the first concerned vertex to the fourth concerned vertex,
the ninth and tenth directional edges being not contained in the first set of weighted directional edges.

6. A delay data processing system according to claim 5, wherein the first concerned edge has a first weight, the second concerned edge has a second weight, and the third concerned edge has a third weight, and
wherein the ninth directional edge has a weight equivalent to a sum of the first weight and the second weight, and the tenth directional edge has a weight equivalent to a sum of the first weight and the third weight.

7. A delay data processing system according to claim 5, wherein the data holding means holds the third set of graphic data as the first set of graphic data.

8. A delay data processing system according to claim 5, wherein the data processing means is operable to process the third set of graphic data as the first set of graphic data.

9. A delay data processing system according to claim 1, wherein the first set of vertices contains:
 a first concerned vertex;
 a second concerned vertex;
 a third concerned vertex; and
 a fourth concerned vertex, and
the first set of weighted directional edges contains:
 a first concerned edge extending from the first concerned vertex to the third concerned vertex;
 a second concerned edge extending from the second concerned vertex to the third concerned vertex; and
 a third concerned edge extending from the third concerned vertex to the fourth concerned vertex, and
wherein the data processing means is operable to process the first set of graphic data to obtain a third set of graphic data representing a third delay network composed of:
 a third set of vertices containing:
  the first concerned vertex,
  the second concerned vertex, and
  the fourth concerned vertex, and
 a third set of weighted directional edges extending between elements of the third set of vertices, the third set of weighted directional edges containing:
  a ninth directional edge extending from the first concerned vertex to the fourth concernd vertex, and
  a tenth directional edge extending from the second concerned vertex to the fourth concerned vertex,
  the ninth and tenth directional edges being not contained in the first set of weighted directional edges.

10. A delay data processing system according to claim 9, wherein the first concerned edge has a first weight, the second concerned edge has a second weight, and the third concerned edge has a third weight, and
wherein the ninth directional edge has a weight equivalent to a sum of the first weight and the third weight, and the tenth directional edge has a weight equivalent to a sum of the second weight and the third weight.

11. A delay data processing system according to claim 9, wherein the data holding means holds the third set of graphic data as the first set of graphic data.

12. A delay data processing system according to claim 9, wherein the data processing means is operable to process the third set of graphic data as the first set of graphic data.

13. A delay data processing system according to claim 1, wherein the first set of vertices contains:
 a first concerned vertex; and
 a second concerned vertex, and
the first set of weighted directional edges contains:
 a first concerned edge extending from the first concerned vertex to the second concerned vertex and having a first weight; and
 a second concerned edge extending from the first concerned vertex to the second concerned vertex and having a second weight not exceeding the first weight, and
wherein the system further comprises another data processing means for processing the first set of graphic data to obtain a third set of graphic data representing a third delay network composed of:
 a third set of vertices containing:
  the first concerned vertex, and
  the second concerned vertex; and
 a third set of weighted directional edges extending between elements of the third set of vertices, the third set of weighted directional edges containing:
  the first concerned edge,
 the third set of weighted directional edges not containing the second concerned edge.

14. A delay data processing system according to claim 13, wherein the data holding means holds the third set of graphic data as the first set of graphic data.

15. A delay data processing system according to claim 13, wherein the data processing means is operable to process the third set of graphic data as the first set of graphic data.

16. A delay data processing system according to claim 1, wherein the first set of vertices contains:
 a first concerned vertex;
 a second concerned vertex;
 a third concerned vertex;
 a fourth concerned vertex; and
 a fifth concerned vertex, and
the first set of weighted directional edges contains:
 a first concerned edge extending from the first concerned vertex to the fifth concerned vertex;
 a second concerned edge extending from the second concerned vertex to the fifth concerned vertex;
 a third concerned edge extending from the fifth concerned vertex to the third concerned vertex; and
 a fourth concerned edge extending from the fifth concerned vertex to the fourth concerned vertex, and
wherein the data processing means is operable to process the first set of graphic data to obtain a third set of graphic data representing a third delay network composed of:
a third set of vertices containing:
 the first concerned vertex,
 the second concerned vertex,
 the third concerned vertex, and
 the fourth concerned vertex,
the third set of vertices not containing the fifth concerned vertex; and
a third set of weighted directional edges extending between elements of the third set of vertices, the third set of weighted directional edges containing:
 a ninth directional edge extending from the first concerned vertex to the fourth concerned vertex,
 a tenth directional edge extending from the second concerned vertex to the third concerned vertex,
 an eleventh directional edge extending from the first concerned vertex to the third concerned vertex, and a twelfth directional edge extending from the second concerned vertex to the fourth concerned vertex, the ninth to twelfth directional edges being not contained in the first set of weighted directional edges.

17. A delay data processing system according to claim 16, wherein the data holding means holds the third set of graphic data as the first set of graphic data.

18. A delay data processing system according to claim 16, wherein the data processing means is operable to process the third set of graphic data as the first set of graphic data.

19. A delay data processing system according to claim 1, wherein the second set of weighted directional edges does not contain the first directional edge, the second directional edge, and the fourth directional edge.

20. A delay data processing system according to claim 19, wherein the second set of weighted directional edges does not contain the third directional edge.

21. A method for processing data representing delays in a logic network, comprising the steps of:

holding a first set of graphic data representing a first delay network composed of:

a first set of vertices comprising a first vertex, a second vertex, a third vertex, and a fourth vertex, and a first set of weighted directional edges extending between elements of the first set of vertices and containing a first directional edge extending from the first vertex to the fourth vertex having a weight x1, a second directional edge extending from the second vertex to the third vertex having a weight x2, a third directional edge extending from the first vertex to the third vertex having a weight p1, and a fourth directional edge extending from the second vertex to the fourth vertex having a weight p2;

determining that the first set of delay data meets the condition (x1+x2)=(p1+p2); and processing the first set of graphic data to obtain a second set of graphic data representing a second delay network composed of:

a second set of vertices comprising the first vertex, the second vertex, the third vertex, the fourth vertex, and a fifth vertex not contained in the first set of vertices, and a second set of weighted directional edges extending between elements of the second set of vertices and containing a fifth directional edge extending from the first vertex to the fifth vertex having a weight of zero, a sixth directional edge extending from the second vertex to the fifth vertex having a weight (x2−p1), a seventh directional edge extending from the fifth vertex to the third vertex having a weight p1, and an eighth directional edge extending from the fifth vertex to the fourth vertex having a weight x1.

22. A delay data processing method according to claim 21, further comprising holding the second set of graphic data as the first set of graphic data.

23. A delay data processing method according to claim 21, wherein the first set of vertices contains:

a first concerned vertex;

a second concerned vertex;

a third concerned vertex; and a fourth concerned vertex, and the first set of weighted directional edges contains:

a first concerned edge extending from the first concerned vertex to the second concerned vertex;

a second concerned edge extending from the second concerned vertex to the third concerned vertex; and a third concerned edge extending from the second concerned vertex to the fourth concerned vertex, and wherein the method further comprises processing the first set of graphic data to obtain a third set of graphic data representing a third delay network composed of:

a third set of vertices containing:

the first concerned vertex, the third concerned vertex, and the fourth concerned vertex, and a third set of weighted directional edges extending between elements of the third set of vertices, the third set of weighted directional edges containing:

a ninth directional edge extending from the first concerned vertex to the third concernd vertex, and a tenth directional edge extending from the first concerned vertex to the fourth concerned vertex, the ninth and tenth directional edges being not contained in the first set of weighted directional edges.

24. A delay data processing method according to claim 23, further comprising holding the third set of graphic data as the first set of graphic data.

25. A delay data processing method according to claim 23, further comprising processing the third set of graphic data as the first set of graphic data.

26. A delay data processing method according to claim 21, wherein the first set of vertices contains:

a first concerned vertex;

a second concerned vertex;

a third concerned vertex; and a fourth concerned vertex, and the first set of weighted directional edges contains:

a first concerned edge extending from the first concerned vertex to the third concerned vertex;

a second concerned edge extending from the second concerned vertex to the third concerned vertex; and a third concerned edge extending from the third concerned vertex to the fourth concerned vertex, and wherein the method further comprises processing the first set of graphic data to obtain a third set of graphic data representing a third delay network composed of:

a third set of vertices containing:

the first concerned vertex, the second concerned vertex, and the fourth concerned vertex, and a third set of weighted directional edges extending between elements of the third set of vertices, the third set of weighted directional edges containing:

a ninth directional edge extending from the first concerned vertex to the fourth concernd vertex, and a tenth directional edge extending from the second concerned vertex to the fourth concerned vertex, the ninth and tenth directional edges being not contained in the first set of weighted directional edges.

27. A delay data processing method according to claim 26, further comprising holding the third set of graphic data as the first set of graphic data.

28. A delay data processing method according to claim 26, further comprising processing the third set of graphic data as the first set of graphic data.

29. A delay data processing method according to claim 21, wherein the first set of vertices contains:

a first concerned vertex; and a second concerned vertex, and the first set of weighted directional edges contains:

a first concerned edge extending from the first concerned vertex to the second concerned vertex and having a first weight; and a second concerned edge extending from the first concerned vertex to the second concerned vertex and having a second weight not exceeding the first weight, and wherein the mehtod further comprises processing the first set of graphic data to obtain a third set of graphic data representing a third delay network composed of:

a third set of vertices containing:
the first concerned vertex, and
the second concerned vertex; and
a third set of weighted directional edges extending between elements of the third set of vertices, the third set of weighted directional edges containing:
the first concerned edge,
the third set of weighted directional edges not containing the second concerned edge.

30. A delay data processing method according to claim 29, further comprising holding the third set of graphic data as the first set of graphic data.

31. A delay data processing method according to claim 29, further comprising processing the third set of graphic data as the first set of graphic data.

32. A delay data processing method according to claim 21, wherein the first set of vertices contains:
a first concerned vertex;
a second concerned vertex;
a third concerned vertex;
a fourth concerned vertex; and
a fifth concerned vertex, and
the first set of weighted directional edges contains:
a first concerned edge extending from the first concerned vertex to the fifth concerned vertex;
a second concerned edge extending from the second concerned vertex to the fifth concerned vertex;
a third concerned edge extending from the fifth concerned vertex to the third concerned vertex; and
a fourth concerned edge extending from the fifth concerned vertex to the fourth concerned vertex, and wherein the data processing method further comprising processing the first set of graphic data to obtain a third set of graphic data representing a third delay network composed of:
a third set of vertices containing:
the first concerned vertex,
the second concerned vertex,
the third concerned vertex, and
the fourth concerned vertex,
the third set of vertices not containing the fifth concerned vertex; and
a third set of weighted directional edges extending between elements of the third set of vertices, the third set of weighted directional edges containing:
a ninth directional edge extending from the first concerned vertex to the fourth concerned vertex,
a tenth directional edge extending from the second concerned vertex to the third concerned vertex,
an eleventh directional edge extending from the first concerned vertex to the third concerned vertex, and
a twelfth directional edge extending from the second concerned vertex to the fourth concerned vertex,
the ninth to twelfth directional edges being not contained in the first set of weighted directional edges.

33. A delay data processing method according to claim 32, further comprising holding the third set of graphic data as the first set of graphic data.

34. A delay data processing method according to claim 32, further comprising processing the third set of graphic data as the first set of graphic data.

35. A logic circuit delay data holding system for holding a set of delay data of a target logic circuit having a multiplicity of inputs and a multiplicity of outputs, the system comprising:

a delay network generation means for responding to set of constitutional data of the logic circuit to generate delay network composed of:
a plurality of source vertices corresponding to a plurality of input terminals of the logic circuit,
a plurality of sink vertices corresponding to a plurality of output terminals of the logic circuit,
a plurality of internal vertices lying on a plurality of paths connecting the source vertices with the sink vertices, and
a plurality of directional edges each interconnecting two of the source, sink and internal vertices, the directional edges being each weighted so that a largest weighted path length between any concerned one of the source vertices and any concerned one of the sink vertices is in accord with a delay time between a corresponding one of the input terminals of the logic circuit and a corresponding one of the output terminals of the logic circuit;

a delay network hold means for holding the set of delay data, as it represents the delay network; and a delay network transform means for transforming the delay network to reduce a quantity of the delay data in the delay network hold means so that all paths of the delay network are represented and the largest weighted path length between the concerned source vertex and the concerned sink vertex is in accord with the delay time between the corresponding input terminal of the logic circuit and the corresponding output terminal of the logic circuit.

36. A logic circuit delay data holding method for holding a set of delay data of a logic circuit with a multiplicity of inputs and a multiplicity of outputs, the logic circuit being a target of a delay computation, the method comprising:

a first step of responding to a set of constitutional data of the logic circuit to generate a delay network including:
a plurality of source vertices corresponding to a plurality of input terminals of the logic circuit,
a plurality of sink vertices corresponding to a plurality of output terminals of the logic circuits, and
a plurality of paths cooperatively connecting the source vertices with the sink vertices, the plurality of paths consisting of a plurality of directional edges each weighted so that a total weight along a most-weighted path between any concerned one of the source vertices and any concerned one of the sink vertices is in accord with a delay time between one of the input terminals corresponding to the concerned source vertex and one of the output terminals corresponding to the concerned sink vertex;

a second step of holding the set of delay data, as it represents the delay network; and a third step of transforming the delay network to reduce a quantity of the delay data so that all paths of the delay network are represented and the total weight along the most-weighted path between the concerned source vertex and the concerned sink vertex is kept in accord with the delay time between said one of the input terminals corresponding to the concerned source vertex and said one of the output terminals corresponding to the concerned sink vertex.

37. A logic circuit delay data holding method according to claim 35, wherein said first step comprises:

generating a first one of the source vertices corresponding to a first one of the input terminals;

generating a first one of the sink vertices corresponding to a first one of the output terminals having a signal-transmittable relationship relative to the first input terminal;

generating a first one of the directional edges connecting the first source vertex with the first sink vertex and having a sense thereof according to a signal transmission direction between the first input terminal and the first output terminal;

calculating a delay time between the first input terminal and the first output terminal; and providing the first directional edge with a first weight representing the delay time.

38. A logic circuit delay data holding method according to claim 37, wherein the delay network further includes one or more internal vertices corresponding to one or more gates of the logic circuit, and wherein said first step further comprises:

generating a first one of the internal vertices corresponding to a first one of the gates connected by a first net to at least one of the first input and first output terminals as a related terminal of the logic circuit;

generating a second one of the directional edges corresponding to the first net, the second directional edge connecting the first internal vertex with one of the first source and first sink vertices corresponding to the related terminal and having a sense thereof according to a signal transmission direction of the first net;

providing the second directional edge with a second weight representing a delay time of the first net; and additionally providing the second directional edge with a third weight representing a delay time of the first gate.

39. A logic circuit delay data holding method according to claim 38, wherein the delay network includes a first graph composed of a pair of triangles joining each other at one point, where they are angled, and wherein said third step comprises transforming the first graph into a second graph composed of a quartet of line segments joining each other at one point, where they end.

40. A logic circuit delay data holding method according to claim 39, wherein said third step further comprises transforming the first graph into a third graph composed of another triangle and a pair of line segments ending at one angle of said another triangle.

41. A logic circuit delay data holding method according to claim 39, wherein the delay network includes a third graph composed of a triple of line segments joining each other at one point, where they end, and wherein said third step further comprises transforming the third graph into a fourth graph composed of a pair of line segments joining each other one point, where they end.

42. A logic circuit delay data holding method according to claim 41, wherein the delay network includes a fifth graph composed of a pair of line segments joining each other at two points, where they end, and wherein said third step further comprises transforming the fifth graph into a sixth graph composed of a single line segment ending at the two points.

* * * * *